United States Patent
Oura et al.

(10) Patent No.: US 8,436,623 B2
(45) Date of Patent: May 7, 2013

(54) ELECTROMAGNETIC LOAD CIRCUIT FAILURE DIAGNOSIS DEVICE

(75) Inventors: Ryoichi Oura, Hitachinaka (JP); Mitsuhiko Watanabe, Odawara (JP); Takuya Mayuzumi, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 73 days.

(21) Appl. No.: 12/740,100

(22) PCT Filed: Jul. 17, 2009

(86) PCT No.: PCT/JP2009/062966
§ 371 (c)(1),
(2), (4) Date: Apr. 27, 2010

(87) PCT Pub. No.: WO2010/024061
PCT Pub. Date: Mar. 4, 2010

(65) Prior Publication Data
US 2011/0141642 A1    Jun. 16, 2011

(30) Foreign Application Priority Data

Sep. 1, 2008 (JP) .................... 2008-223930

(51) Int. Cl.
*G01R 31/02* (2006.01)

(52) U.S. Cl.
USPC .......................................... 324/537

(58) Field of Classification Search .......... None
See application file for complete search history.

(56) References Cited

U.S. PATENT DOCUMENTS

| | | | |
|---|---|---|---|
| 4,541,389 A * | 9/1985 | Kosak et al. ............ | 361/152 |
| 4,771,755 A | 9/1988 | Asakura et al. | |
| 6,900,973 B2 * | 5/2005 | Tojo et al. ............... | 361/139 |
| 8,144,447 B2 * | 3/2012 | Oura et al. ............... | 361/143 |
| 2004/0118384 A1 | 6/2004 | Oyama et al. | |
| 2005/0270034 A1 | 12/2005 | Tsuchiya | |
| 2011/0075314 A1 * | 3/2011 | Bauer et al. ............. | 361/152 |

FOREIGN PATENT DOCUMENTS

| | | |
|---|---|---|
| JP | 63-111257 A | 5/1988 |
| JP | 11-13519 A | 1/1999 |
| JP | 2002-176346 A | 6/2002 |
| JP | 2004-124890 A | 4/2004 |
| JP | 2004-201410 A | 7/2004 |
| JP | 2004-347423 A | 12/2004 |
| JP | 2006-17696 A | 1/2006 |
| JP | 2007-214905 A | 8/2007 |

OTHER PUBLICATIONS

English translation of JP2004-201410 filed on Jul. 15, 2004.*
English translation of JP2004-347423 filed on Dec. 9, 2004.*
International Search Report dated Aug. 11, 2009 (Two (2) pages).
Form PCT/ISA/237 (Three (3) pages).
Japanese-language Office Action dated Oct. 16, 2012 (two (2) pages).
Notice of Reasons for Rejection dated Jul. 24, 2012 with English translation (five (5) pages).

* cited by examiner

*Primary Examiner* — Jermele M Hollington
(74) *Attorney, Agent, or Firm* — Crowell & Moring LLP

(57) ABSTRACT

A layer short-circuit of a switch element such as a FET included in an electromagnetic load circuit is detected to accurately perform a failure diagnosis of the electromagnetic load circuit. A failure diagnosis circuit 101 is provided which detects a layer short-circuit in which a high-side switch element, a low-side switch element, or an electromagnetic load itself short-circuits with a power supply voltage terminal or a ground in a state of having a predetermined impedance to perform a failure diagnosis.

5 Claims, 20 Drawing Sheets

ELECTROMAGNETIC LOAD CIRCUIT FAILURE DIAGNOSIS DEVICE

TECHNICAL FIELD

The present invention relates to an electromagnetic load circuit failure diagnosis device. In particular, the present invention relates to a failure diagnosis device for a circuit including an electromagnetic load (inductance load) of a fuel injection valve of an internal-combustion engine or the like.

BACKGROUND ART

Internal-combustion engines fueled by gasoline, light oil, or the like and which are used in automobiles, motorcycles, agricultural machinery, industrial machinery, marine engines, and the like include those designed to improve fuel efficiency and output by directly injecting fuel into a cylinder using an injector (fuel injection valve).

Since such intra-cylinder direct-injection internal-combustion engines supply an injector with fuel pressurized to a higher pressure than in conventional systems and inject high-pressure fuel into a cylinder from the injector, a significant amount of energy (valve-opening electromagnetic force) is required for a valve-opening operation of the injector.

In consideration thereto, there is a recent trend towards an increase in a current applied to an electromagnetic load such as an injector used in an intra-cylinder direct-injection internal-combustion engine, resulting in an increase in the probability of failures in electromagnetic load circuits including an electromagnetic load and a driver circuit element. As a result, there is a growing demand for fragmentation and a higher degree of accuracy in failure diagnosis of electromagnetic load circuits.

An example of a circuit configuration including an injector for direct injection will be described with reference to FIG. 19.

An injector 20 that is an electromagnetic load has a positive terminal connected by a VB high-side driver 16 and a VH high-side driver 14, which are switch elements, to any of a power supply terminal 15 with standard voltage (battery voltage VB) and a high-voltage power supply terminal 13 with a boosting voltage VH and which is boosted to a higher voltage than the battery voltage VB. A diode 17 for backflow prevention is connected between the VB high-side driver 16 and the VH high-side driver 14. A negative terminal of the injector 20 is connected to a ground (GND) via a low-side driver 18 that is a switch element and a shunt resistance 22.

In this case, the side of a voltage terminal as seen from the electromagnetic load 20 will be referred to as a high side (upstream) and the side of the power supply ground (GND) as a low side (downstream).

The VB high-side driver 16, the VH high-side driver 14, and the low-side driver 18 are respectively driven-controlled by driver driving signals (c), (b), and (f) outputted by a VB high-side driver driving signal generating circuit 7, a VH high-side driver driving signal generating circuit 8, and a low-side driver driving signal generating circuit 9. The respective driver driving signal generating circuits 7, 8, and 9 generate control signals while being associated with each other by a logic signal outputted by a logic circuit 3 logic-operated by a control signal (a) of a microprocessor unit (MPU) 1.

A current detecting circuit 24 that detects a current flowing through the injector 20 is connected to the shunt resistance 22. A voltage detecting circuit 28 is connected to the current detecting circuit 24. The voltage detecting circuit 28 receives an input of a first reference voltage (h) from a first reference voltage generating circuit 26, and inputs a first voltage detection signal (i) to the logic circuit 3.

As illustrated in FIG. 20 as a shunt resistance conductive current (injector current), in a current waveform of the representative injector 20 for direct injection, the injector current is raised in a short period of time to a predetermined peak current stopping current using a boosting voltage VH during a peak current conduction period in an initial stage of conduction.

Next, in order to open a valve of the injector 20 for a predetermined amount of time, an injector current of a predetermined current value is held using a battery voltage by a switching operation of the VB high-side driver 16. At the end of injection, in order to swiftly close the valve of the injector 20, a conductive current drop of the injector conductive current is performed in a short period of time by the low-side driver 18 to interrupt the injector current (for example, refer to Patent Document 1).

Specifically, a rise in the control signal (a) outputted from the MPU 1 changes the VH high-side driver driving signal (b) to low and the low-side driver driving signal (f) to high, and a shunt resistance conductive current (g) that is equivalent to an electromagnetic load conductive current reaches a peak current threshold Ap. After reaching the peak current threshold Ap, the shunt resistance conductive current reaches a holding current threshold Ah1 and chopping of the VB high-side driver driving signal (b) occurs. After the elapse of a certain period of time, the first reference voltage (h) is switched and a transition to a holding current threshold Ah2 occurs. The injector 20 is controlled in the flow described above.

Moreover, in FIG. 20, reference character (d) denotes an electromagnetic load (injector) upstream voltage, (h) an electromagnetic load (injector) downstream voltage, and (i) a first voltage detection signal.

The electromagnetic load circuit described above is incapable of diagnosing a failure of a short-circuit of the upstream and the downstream of a switch element in a state where the switch element for holding the injector current to a predetermined current value, i.e., the VB high-side driver 16, has a certain impedance, that is, a layer short-circuit failure.

When a layer short-circuit failure E occurs at a switch element such as a FET comprising the VB high-side driver 16, since full switching cannot be performed in a current holding section, the shunt resistance conductive current drops significantly. However, since a total failure has not yet occurred, a weak current can be applied. Because a layer short-circuit failure is not a complete breakdown, for example, a current passing through the layer short-circuit failure may be neither excessively large nor excessively small and has conventionally been considered difficult to diagnose.

An abnormality detection apparatus capable of detecting a layer short-circuit of an electromagnetic load focuses on a reduction of the period of time required to reach a peak current threshold in the event of a layer short-circuit, and involves detecting a layer short-circuit by detecting an overcurrent using a current detecting circuit installed on a high-side driver switch element (for example, Patent Document 2).

However, the abnormality detection apparatus performs layer short-circuit detection of an electromagnetic load and is not intended to detect a layer short-circuit of a switch element. Therefore, the abnormality detection apparatus is incapable of detecting a layer short-circuit of a switch element.

In addition, there is an abnormality detection apparatus that detects GND short-circuit or open-circuit abnormalities with respect to the downstream of an electromagnetic load (for example, Patent Document 3).

However, this abnormality detection apparatus is similarly not intended to detect an occurrence of a layer short-circuit at a switch element and is incapable of detecting a layer short-circuit of a switch element.

A layer short-circuit of a switch element is not a total failure and is therefore difficult to identify, and as things stand, a failure in an electromagnetic load circuit including a switch element cannot be precisely identified. This problem not only applies to injector circuits of internal-combustion engines, but also applies to electromagnetic load circuits in general.

Patent Document 1: JP Patent Publication (Kokai) No. 2004-124890 A
Patent Document 2: JP Patent Publication (Kokai) No. 2002-176346 A
Patent Document 3: JP Patent Publication (Kokai) No. 2004-347423 A

DISCLOSURE OF THE INVENTION

Problems to be Solved by the Invention

The present invention has been made in consideration of the aforementioned problems to be solved, and an object thereof is to provide a failure diagnosis device that detects a layer short-circuit of a switch element such as a FET included in an electromagnetic load circuit and precisely performs a failure diagnosis of the electromagnetic load circuit.

Means for Solving the Problems

In order to achieve the object described above, an electromagnetic load circuit failure diagnosis device according to the present invention is a failure diagnosis device in which a high-side switch element is connected on a side of a power supply voltage terminal of an electromagnetic load provided between the power supply voltage terminal and a ground, a low-side switch element connected on the ground side, the high-side switch element and the low-side switch element opened/closed by a control signal of a switch element driving signal generating circuit, wherein the failure diagnosis device includes failure diagnosis means that detects a layer short-circuit failure in which the high-side switch element, the low-side switch element or the electromagnetic load itself short-circuits with the power supply voltage terminal or the ground in a state of having a predetermined impedance, and performs a failure diagnosis.

In an electromagnetic load circuit failure diagnosis device according to the present invention, the failure diagnosis means preferably performs a layer short-circuit failure diagnosis at a timing of a rise or a fall of a control signal inputted to the switch element driving signal generating circuit.

In an electromagnetic load circuit failure diagnosis device according to the present invention, the failure diagnosis means preferably detects a layer short-circuit failure by comparing the number of on/off operations of chopping of the high-side switch element or the low-side switch element with a predetermined number of times that is a failure diagnosis threshold.

In an electromagnetic load circuit failure diagnosis device according to the present invention, the failure diagnosis means preferably performs a layer short-circuit failure diagnosis by counting the number of times an electrical value correlated with a current value of the electromagnetic load exceeds a predetermined threshold.

In an electromagnetic load circuit failure diagnosis device according to the present invention, the failure diagnosis means preferably performs a layer short-circuit failure diagnosis by measuring a period of time from the start of driving at a timing of a rise or a fall of a control signal inputted to the switch element driving signal generating circuit until when a current value of the electromagnetic load exceeds a predetermined threshold.

In an electromagnetic load circuit failure diagnosis device according to the present invention, the failure diagnosis means preferably performs a layer short-circuit failure diagnosis based on whether or not a voltage value of the upstream or the downstream of the electromagnetic load reaches a predetermined threshold.

In an electromagnetic load circuit failure diagnosis device according to the present invention, preferably, the switch element driving signal generating circuit generates a switch element driving signal based on a feedback compensation of an electrical signal correlated with a current value of the electromagnetic load, and the failure diagnosis means performs a layer short-circuit failure diagnosis by counting the number of on/off operations of the switch element driving signal and comparing the counted number of on/off operations with a predetermined threshold.

In an electromagnetic load circuit failure diagnosis device according to the present invention, the failure diagnosis means preferably performs a layer short-circuit failure diagnosis based on whether or not a level of an output signal of the high-side switch element equals or exceeds a predetermined threshold.

In an electromagnetic load circuit failure diagnosis device according to the present invention, preferably, the switch element driving signal generating circuit generates a switch element driving signal based on a feedback compensation of an electrical signal correlated with a current value of the electromagnetic load, and the failure diagnosis means performs a layer short-circuit failure diagnosis based on whether or not a level of the switch element driving signal equals or exceeds a threshold.

Advantages of the Invention

An electromagnetic load circuit failure diagnosis device according to the present invention performs a failure diagnosis by comparing a switching signal regarding a switch element comprising a driver circuit of an electromagnetic load injection apparatus with a predetermined comparison signal. Consequently, a layer short-circuit failure in which the upstream and the downstream of a switch element such as a FET which drives an electromagnetic load short-circuits in a state where the switch element has a certain impedance can be reliably and accurately detected, and an improvement in safety can be expected.

The present specification includes the contents described in the specification and/or drawings of Japanese Patent Application No. 2008-223930, which is the basis of priority of the present application.

DESCRIPTION OF SYMBOLS

1 . . . microprocessor, 3 . . . logic circuit, 7 . . . VB high-side driver-driving analog signal generating circuit, 8 . . . VH high-side driver-driving analog signal generating circuit, 9 . . . low-side driver-driving analog signal generating circuit, 13 . . . VH power supply voltage terminal, 14 . . . VH high-side driver, 15 . . . VB power supply voltage terminal, 16 . . . VB high-side driver, 17 . . . backflow preventing element, 18 . . . low-side driver, 20 . . . electromagnetic load, 22 . . . shunt resistance, 24 . . . current detecting circuit, 26 . . . first reference voltage generating circuit, 28 . . . first voltage detecting circuit, 30 . . . diagnosis window signal generating circuit, 32 . . . AND circuit, 34 . . . counter circuit, 36 . . . clock signal generating circuit, 38 . . . second reference voltage generating circuit, 40 . . . second voltage detecting circuit, 42 . . . chopping time processing circuit, 43 . . . diagnosis unit, 55 . . . switching signal generating circuit, 57 . . . logic signal synthesizing circuit, 59 . . . analog signal generating circuit, 60 . . . chopping signal synthesizing circuit, 101 . . . failure diagnosis circuit, 300 . . . electromagnetic load driving circuit, 301 . . . switch element driving signal generating circuit

BEST MODE FOR CARRYING OUT THE INVENTION

Figure 19:
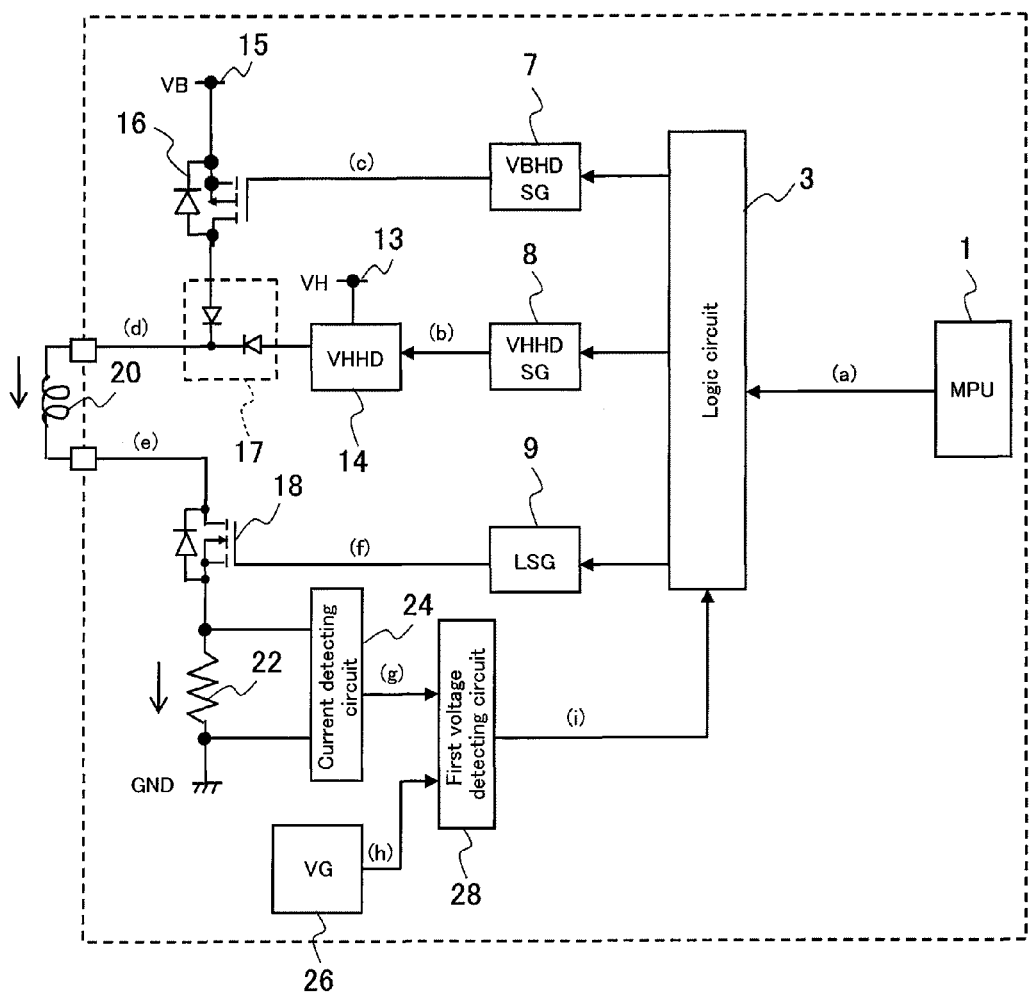
FIG. 19 is a block diagram illustrating a conventional example of an electromagnetic load circuit failure diagnosis device.
Figure 20:
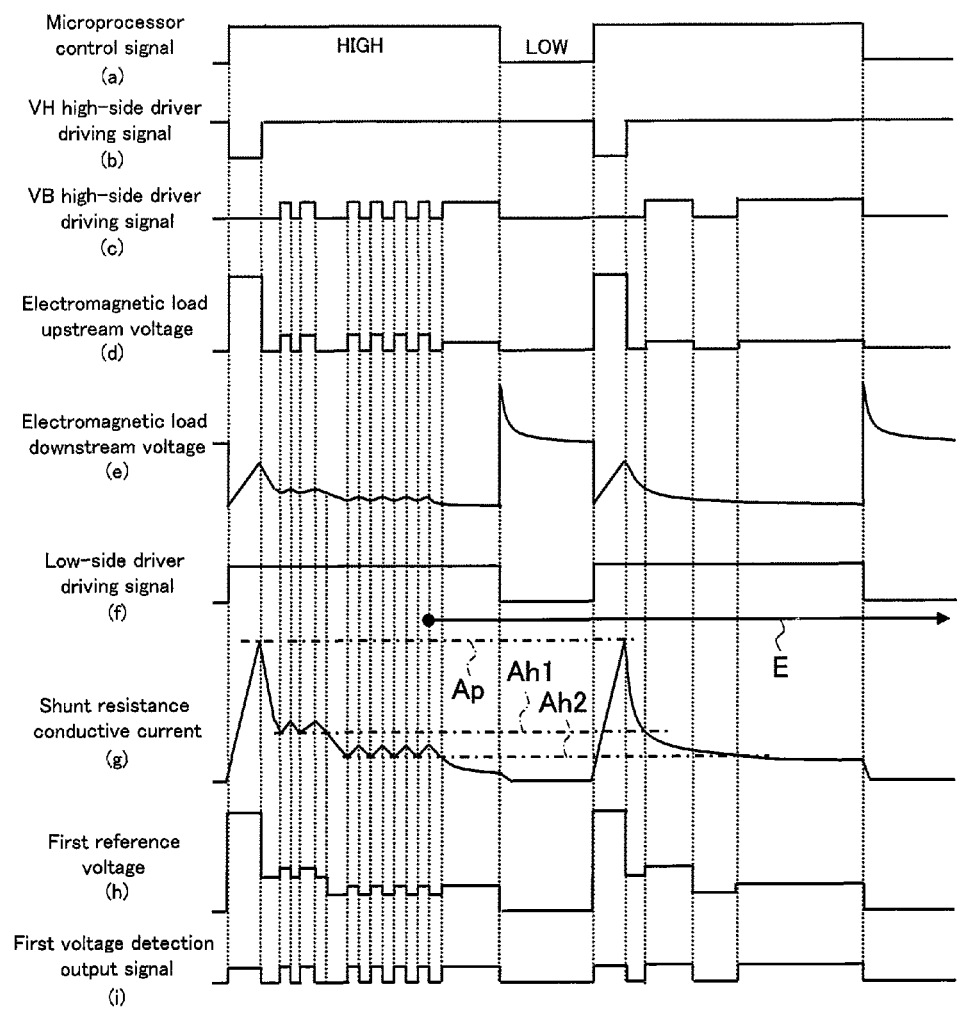
FIG. 20 is a time chart illustrating an operation waveform of a failure diagnosis device according to a conventional example.

Hereinafter, embodiments of an electromagnetic load circuit failure diagnosis device according to the present invention will be described with reference to the appended drawings. In the following description of the embodiments, components equal to or equivalent to the electromagnetic load circuit illustrated in FIG. 19 will be described by assigning the same reference characters as assigned to FIG. 19.

First Embodiment

Figure 1:
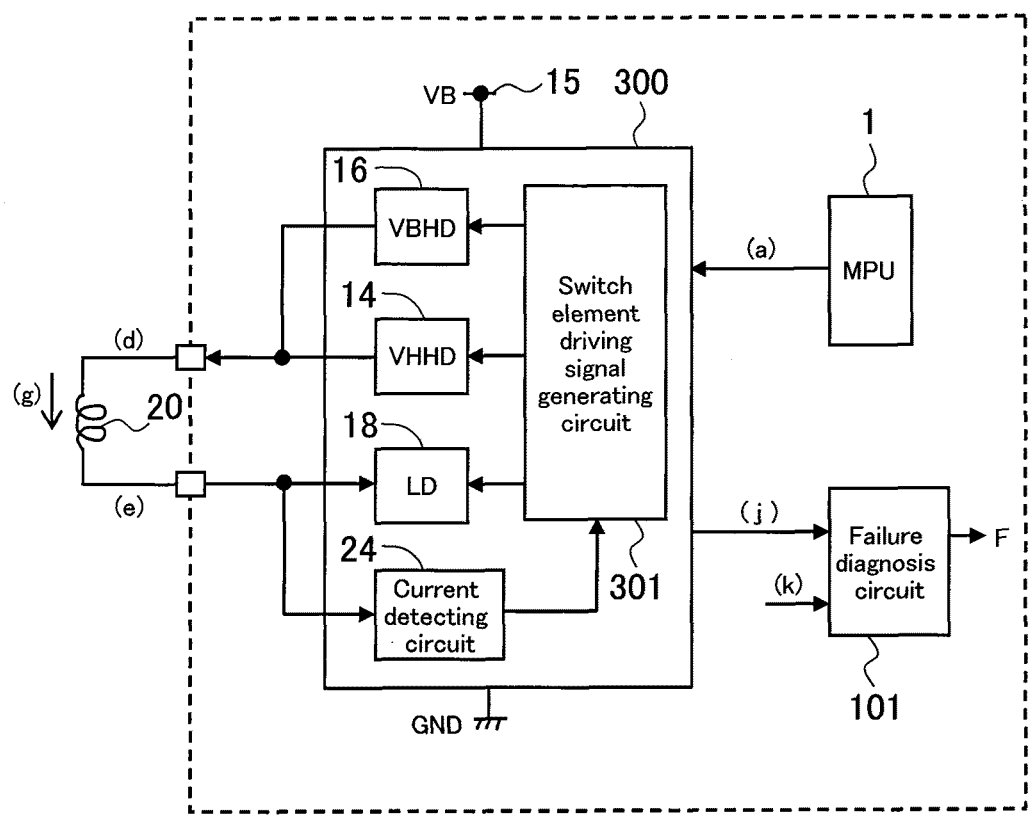
FIG. 1 is a block diagram illustrating a first embodiment of an electromagnetic load circuit failure diagnosis device according to the present invention.

A first embodiment of an electromagnetic load circuit failure diagnosis device according to the present invention will now be described with reference to FIGS. 1 and 2.

An electromagnetic load circuit according to the present embodiment includes: an electromagnetic load (injector) 20 installed between a battery voltage terminal 15 and a power supply ground (GND); a microprocessor unit (MPU) 1; an electromagnetic load driving circuit 300; and a failure diagnosis circuit 101.

A VB high-side driver 16, a VH high-side driver 14, and a low-side driver 18 constituted by switch elements (e.g., FETs) that respectively make up electromagnetic load drivers are installed on the side of the battery voltage terminal 15 and the side of the power supply ground (GND) of the electromagnetic load driving circuit 300 as seen from the electromagnetic load 20.

In this case, the side of the battery voltage terminal 15 as seen from the electromagnetic load 20 will be referred to as a high side (upstream) and the side of the power supply ground (GND) as a low side (downstream).

The electromagnetic load driving circuit 300 includes a switch element driving signal generating circuit 301 and a current detecting circuit 24. The current detecting circuit 24 detects a conductive current of the electromagnetic load 20. A current detection signal of the current detecting circuit 24 is fed back and inputted to the switch element driving signal generating circuit 301.

A control signal (a) outputted from the microprocessor 1 is inputted to the electromagnetic load driving circuit 300. The electromagnetic load driving circuit 300 generates a switch element driving signal based on the control signal (a) using the switch element driving signal generating circuit 301, and inputs the switch element driving signal into the VB high-side driver 16, the VH high-side driver 14, and the low-side driver 18.

Figure 2:
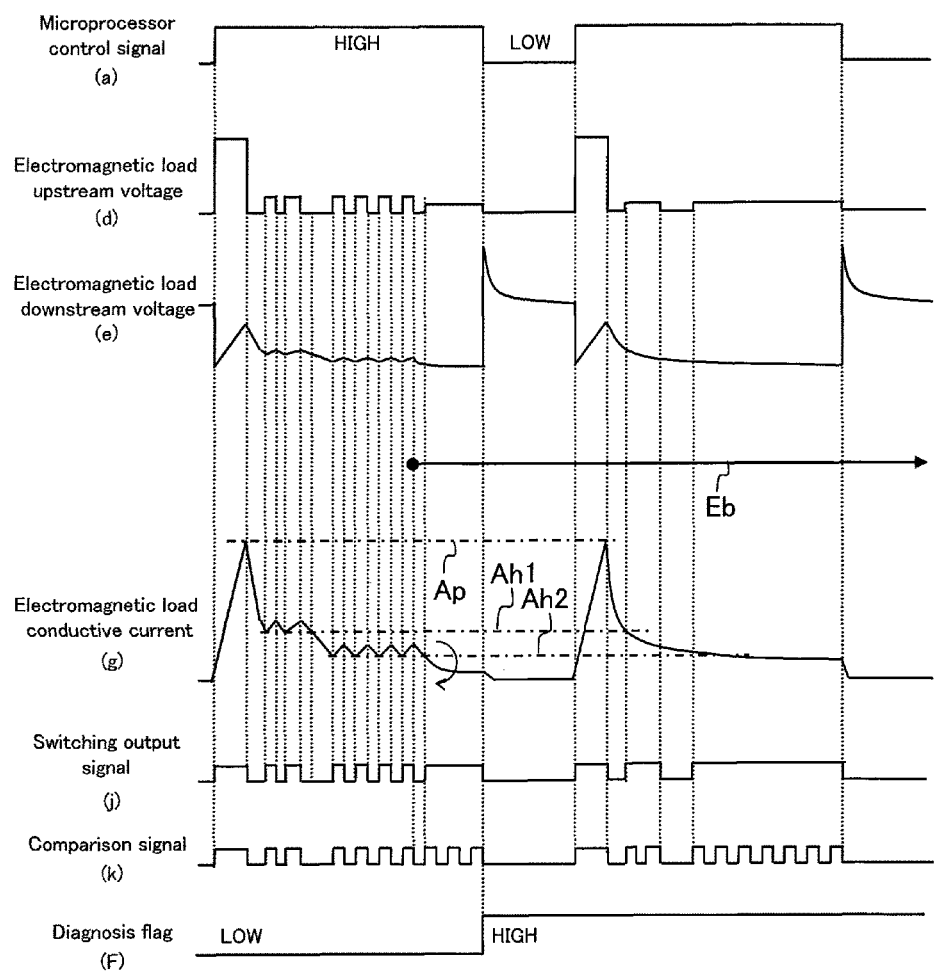
FIG. 2 is a time chart illustrating an operation waveform of a failure diagnosis device according to the first embodiment.

As illustrated in FIG. 2, when the control signal (a) outputted from the MPU 1 is switched from low to high, a driving signal generated by the switch element driving signal generating circuit 301 drives the switch elements (the VB high-side driver 16, the VH high-side driver 14, and the low-side driver 18), and a current is first conducted through the electromagnetic load 20 by the VH high-side driver 14. An electromagnetic load conductive current (g) at this point is, for example, a relatively large current (Ap) of a magnitude necessary for responsively driving (for example, opening a valve of) a valving element of the electromagnetic load 20 such as an injector.

After the electromagnetic load 20 is driven by the VH high-side driver 14, a current of a magnitude needed to continuously maintain the state of the valving element after driving is supplied to the electromagnetic load 20 over a predetermined period of time in the following manner. During this current holding period, the VB high-side driver driving signal maintains an on-state (in other words, the VB high-side driver 16 maintains an on-state), the VH high-side driver driving signal maintains an off-state (in other words, the VH high-side driver 14 maintains an off-state), and a chopping driving signal is further generated by the switch element driving signal generating circuit 301. As a result, the electromagnetic load 20 is chopped.

The electromagnetic load conductive current (g) during the current holding period after driving of the electromagnetic load 20 can be maintained at a predetermined current value (Ah1, Ah2) by feeding back an output signal of the current detecting circuit 24 to the switch element driving signal generating circuit 301. The voltage waveforms of the upstream and the downstream of the electromagnetic load 20 at this point are shown as reference characters (d) and (e).

When a layer short-circuit failure Eb occurs at the switch element of the VB high-side driver 16, as illustrated in FIG. 2, the electromagnetic load conductive current (g) is held at a value lower than the holding current threshold Ah2 and not equal to 0. At this point, a switching output signal (j) outputted from a specific switch element is compared with a predetermined comparison signal (k) by the failure diagnosis circuit 101. When a difference exists, a diagnosis flag F is outputted (changed to high) at a timing of a fall (or rise) of the control signal (a) of the microprocessor 1.

When the microprocessor control signal (a) once again changes to high during the duration of the layer short-circuit failure Eb, the electromagnetic load conductive current (g) is conducted until reaching the current value (Ap) by the driving of the VH high-side driver 14. However, in a segment in which driving is performed by the HB high-side driver 16, the electromagnetic load conductive current (g) is dropped to and held at a value lower than Ah2 and not 0 without switching.

Normally, two types of switch element failures are conceivable. One is an open-circuit, and the other a short-circuit. An open-circuit of a switch element means that switching cannot be performed and no conduction occurs. Conventionally, an open-circuit failure diagnosis of this failure is performed by monitoring a conductive current.

When a short-circuit of a switch element occurs, on-resistance becomes infinitesimal and an overcurrent flows when switching. A flow of an overcurrent causes a switch element to be completely destroyed by a meltdown of a wiring or the like and to enter an open-circuit state in which conduction is disabled. Eventually, an open-circuit failure is to be diagnosed.

Herein, an output layer short-circuit failure of a switch element is a third failure type. In a case of a switch element such as a FET, a short-circuit failure may occur between the upstream and the downstream of the switch element in a state where the switch element holds a certain impedance. In the case of such a failure, switching can be performed with an input signal. However, when a normal on-resistance is not reached, the conductive current does not become 0 (zero) and is to flow insufficiently.

In the present embodiment, since a state where such insufficient current flows can be detected, highly reliable failure diagnosis can be realized.

Second Embodiment

Figure 3:
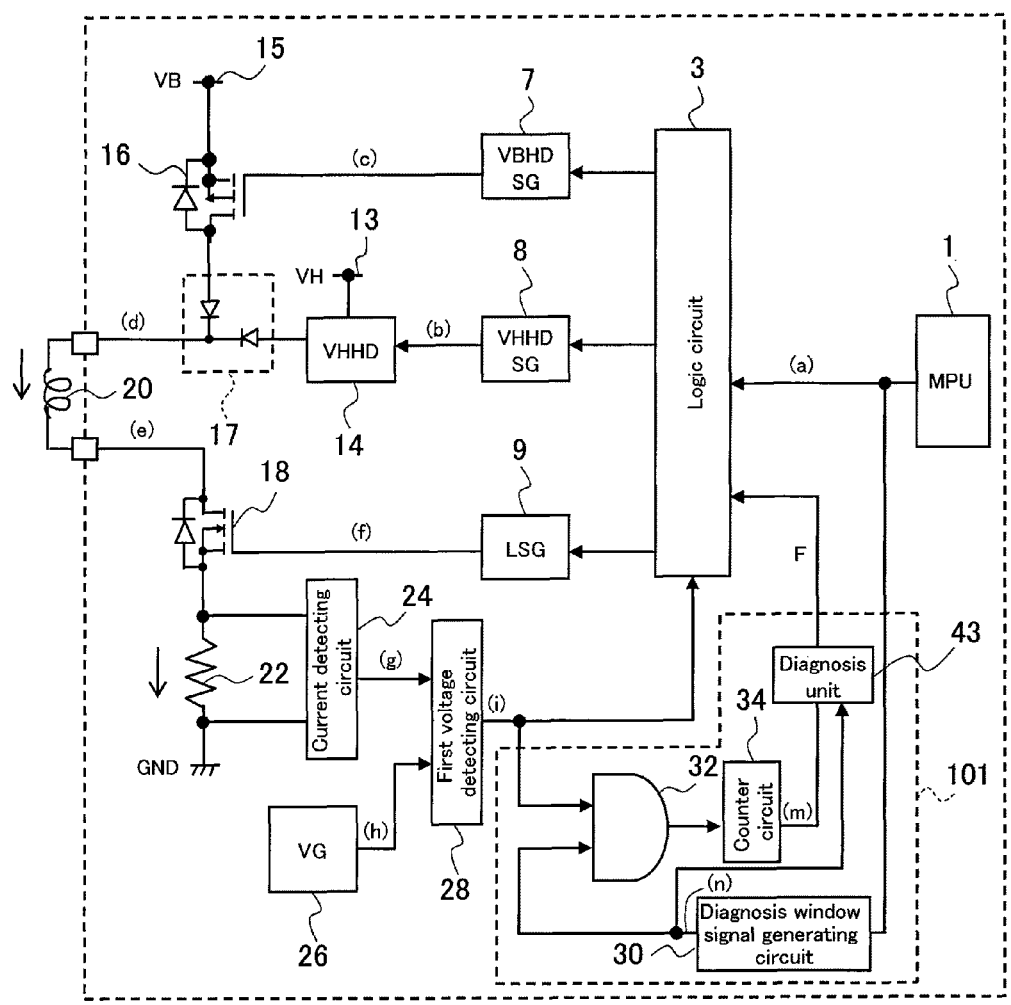
FIG. 3 is a block diagram illustrating a second embodiment of an electromagnetic load circuit failure diagnosis device according to the present invention.
Figure 4:
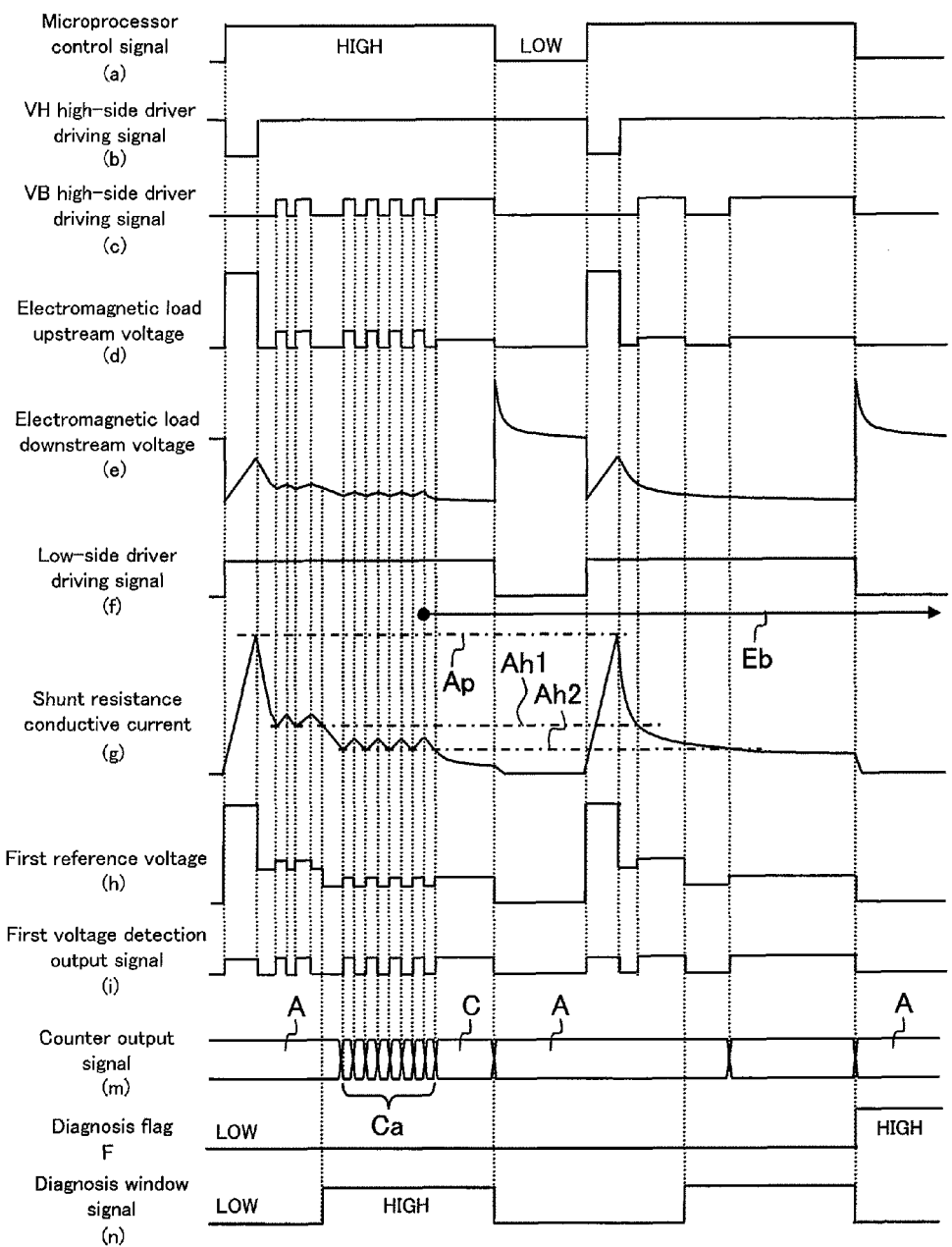
FIG. 4 is a time chart illustrating an operation waveform of a failure diagnosis device according to the second embodiment.

A second embodiment (specific example) of an electromagnetic load circuit failure diagnosis device according to the present invention will now be described with reference to FIGS. 3 and 4.

An electromagnetic load 20 has a positive terminal connected by a VB high-side driver 16 and a VH high-side driver 14, which are switch elements, to any of a power supply terminal 15 with standard voltage (battery voltage, VB) and a high-voltage power supply terminal 13 with a boosting voltage VH and which is boosted to a higher voltage than the battery voltage VB. A diode 17 for backflow prevention is connected between the VB high-side driver 16 and the VH high-side driver 14. A negative terminal of the injector 20 is connected to the ground (GND) via a low-side driver 18 that is a switch element.

In this case also, the side of a voltage terminal as seen from the electromagnetic load 20 will be referred to as a high side (upstream) and the side of the power supply ground (GND) as a low side (downstream).

The VB high-side driver 16, the VH high-side driver 14, and the low-side driver 18 are respectively driven-controlled by driver driving signals (control signals) outputted by a VB high-side driver driving signal generating circuit 7, a VH high-side driver driving signal generating circuit 8, and a low-side driver driving signal generating circuit 9. The respective driver driving signal generating circuits 7, 8, and 9 generate control signals while being associated with each other by a logic signal outputted by a logic circuit 3 logic-operated based on feedback compensation by an electrical signal correlated with an output signal of a microprocessor unit (MPU) 1 and a current value of an electromagnetic load.

A shunt resistance 22 is connected between the low-side driver 18 and the power supply ground (GND) in order to detect an electromagnetic load conductive current. A current detecting circuit 24 is connected to the shunt resistance 22. A first voltage detecting circuit 28 is connected to the current detecting circuit 24. The first voltage detecting circuit 28 receives an input of a first reference voltage (h) from a first reference voltage generating circuit 26, and inputs a first voltage detection signal (i) to the logic circuit 3.

A logic circuit 3 inputs the first voltage detection signal (i) as an electrical signal correlated with a current value of an electromagnetic load, performs a logic computation using the first voltage detection signal (i) and a control signal (a) outputted from the microprocessor 1, and outputs a driving signal for each driver to the analog driving signal generating circuits 7, 8, and 9 of the respective drivers. In this manner, the analog driving signal generating circuits 7 and 8 are to generate a switch element driving signal based on feedback compensation of an electrical signal correlated with a current value of the electromagnetic load 20.

A failure diagnosis circuit 101 includes a diagnosis window signal generating circuit 30, an AND circuit 32, a counter circuit 34, and a diagnosis unit (diagnosis circuit) 43. The failure diagnosis circuit 101 inputs a first voltage detection signal 29 into the AND circuit 32 and outputs a diagnosis flag F from the diagnosis unit 43.

The boosting voltage VH of the high-voltage power supply terminal 13 is obtained by boosting the battery voltage VB and is applied to the electromagnetic load 20 by the VH high-side driver 14. Accordingly, a current flowing through the electromagnetic load 20 can be raised rapidly in a short period of time. Subsequently, the battery voltage VB of the power supply terminal 15 is applied to the electromagnetic load 20 by the VB high-side driver 16 and an electromagnetic load conductive current is held at a predetermined value.

This process will be described below including FIG. 4. The control signal (a) outputted from the microprocessor 1 is inputted to the logic circuit 3. Based on the control signal (a) and the first voltage detection signal (i), the logic circuit 3 outputs driving signals of the respective drivers which are logic signals to the analog driving signal generating circuits 7, 8, and 9 of the respective drivers.

Based on the inputted logic signals, the analog driving signal generating circuits 7, 8, and 9 generate a VB high-side driver driving signal (c), a VH high-side driver driving signal (b), and a low-side driver driving signal (f) which are analog signals. The analog driving signals conduct (turn on) the VB high-side driver 16, the VH high-side driver 14, and the low-side driver 18, passes a current (electromagnetic load current) through the electromagnetic load 20, and drives the electromagnetic load 20.

A shunt resistance conductive current (g) at the start of conduction is, for example, a relatively large current of a magnitude required for responsively driving (for example, opening a valve of) a valving element of the electromagnetic load 20 such as an injector that performs fuel injection in an internal-combustion engine.

After driving of the electromagnetic load 20, a current of a magnitude needed to continuously maintain the state of the valving element after driving is supplied to the electromagnetic load 20 over a predetermined period of time in the following manner. In this case, the low-side driver driving signal 12 maintains an on-state (accordingly, the low-side driver 10 maintains an on-state), the VH high-side driver driving signal 11 is turned off (accordingly, the VH high-side driver 14 enters an off-state), the electromagnetic load 20 is chopped by an operation of the VB high-side driver driving signal generating circuit 7, and a state after driving of the electromagnetic load 20 is maintained. A chopping driving signal is outputted from the logic circuit 3 based on the control signal (a) from the microprocessor 1.

When a layer short-circuit failure Eb occurs at the switch element of the VB high-side driver 16, the shunt resistance conductive current (g) is held at a value lower than the holding current threshold Ah2 and not equal to 0. At this point, the failure diagnosis circuit 101 performs a layer short-circuit failure diagnosis of the switch element of the VB high-side driver 16.

Hereinafter, operations of the failure diagnosis circuit will be described with reference to FIG. 4. A current (g) flowing through the shunt resistance 22 is detected by the current detecting circuit 24, and a voltage value equivalent to the current (g) (an electrical value correlated with the current value of the electromagnetic load) is compared with a first reference voltage (h) generated by the first reference voltage generating circuit 26. When the equivalent voltage value reaches the first reference voltage (h), a first voltage detection output signal (i) is inverted.

The first voltage detection output signal (i) is taken as a first input signal of the AND circuit 32 of the failure diagnosis circuit 101 while a diagnosis window signal (n) generated by the diagnosis window signal generating circuit 30 based on the control signal (a) of the microprocessor 1 is taken as a second input signal of the AND circuit 32, whereby a logical AND of the two input signal is calculated to perform a diagnosis. This means that a diagnosis is to be performed as long as the diagnosis window signal (n) is turned on.

Signals outputted by the AND circuit 32 (to be referred to as chopping signals) are counted by the counter circuit 34. In a state where current control and chopping are performed normally, a counter output signal (m) of the counter circuit 34 is counted up Ca starting from a count initial value A until a count final value C is reached. The count final value C is inputted to the diagnosis unit 43 and compared with a predetermined count value.

In the case of a layer short-circuit failure, since the shunt resistance conductive current (g) is held to a value lower than the holding current threshold Ah2 and not equal to 0, chopping control is not performed and a chopping signal is not outputted. Therefore, a count-up by the counter circuit 34 does not take place and a count value does not reach a predetermined threshold. This results in a judgment by the diagnosis unit 43 at a fall of the diagnosis window signal (n) and a high output of a diagnosis flag F.

Similarly, when a layer short-circuit failure of the switch element of the VH high-side driver 14 occurs, chopping is not performed and a count-up of the number of on/off control operations of chopping is not executed because the current value does not reach a predetermined threshold. This results in a high output of the diagnosis flag F.

As seen, in the present embodiment, a layer short-circuit failure is detected by counting the number of on/off operations of chopping of the switch element of the VB high-side driver 16. The detection of a layer short-circuit failure enables a highly reliable electromagnetic load driving circuit to be realized.

Third Embodiment

Figure 5:
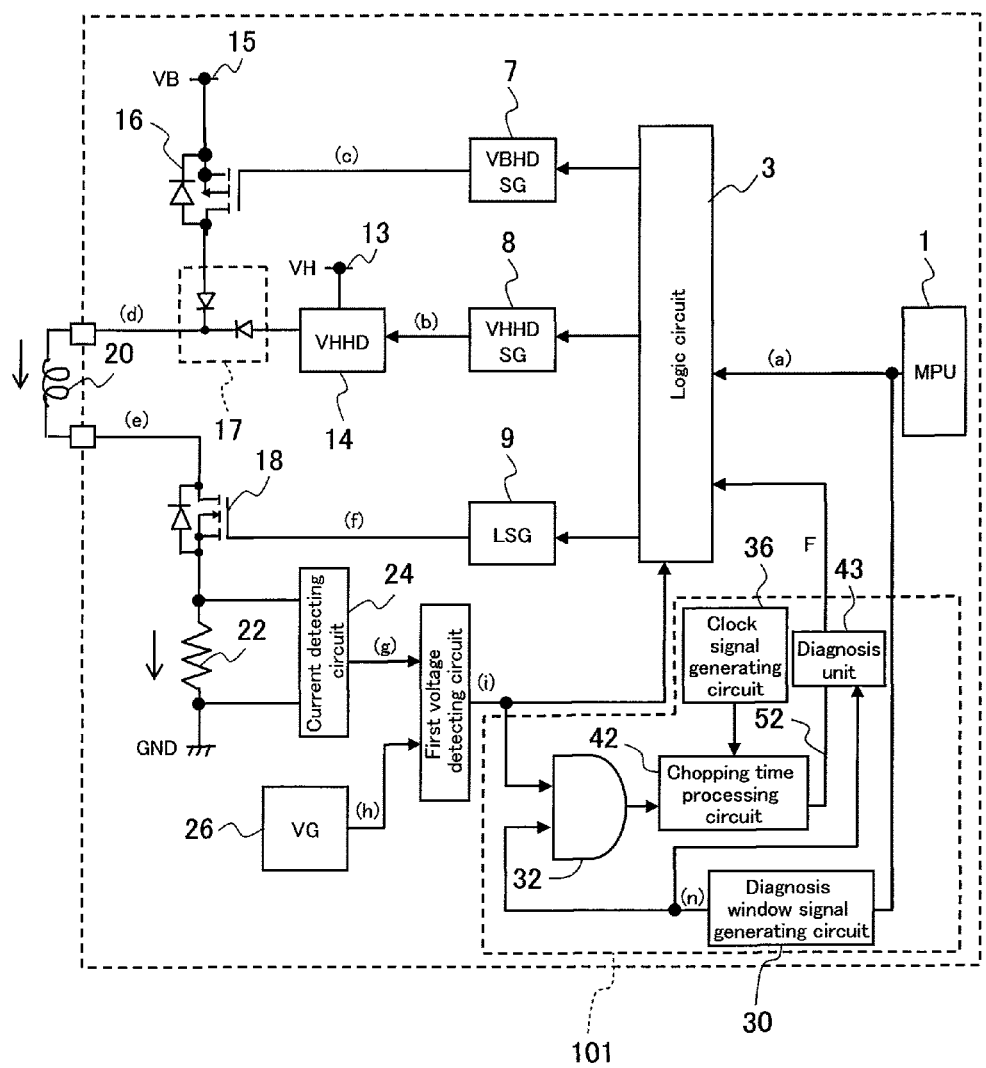
FIG. 5 is a block diagram illustrating a third embodiment of an electromagnetic load circuit failure diagnosis device according to the present invention.
Figure 6:
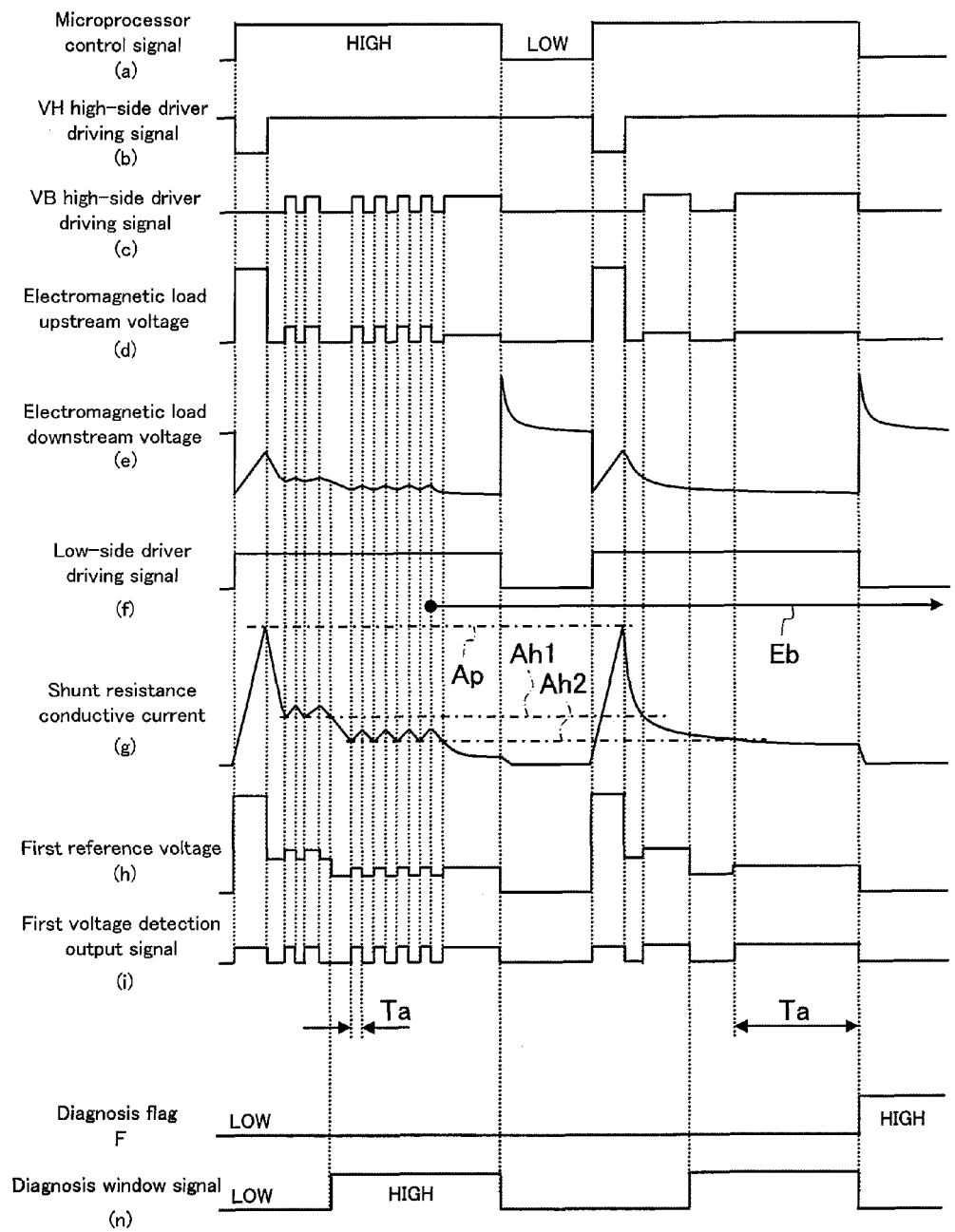
FIG. 6 is a time chart illustrating an operation waveform of a failure diagnosis device according to the third embodiment.

A third embodiment (specific example) of an electromagnetic load circuit failure diagnosis device according to the present invention will now be described with reference to FIGS. 5 and 6.

In the present embodiment, a chopping time processing circuit 42 is provided in place of the counter circuit 34 in the failure diagnosis circuit 101 according to the second embodiment, and a clock signal generating circuit 36 is added. After starting driving at a timing of a rise or a fall of a control signal to be inputted to a switch element driving signal generating circuit, a layer short-circuit failure diagnosis is performed by measuring a period of time needed for a current value of an electromagnetic load 20 to exceed a predetermined threshold.

Hereinafter, details of the third embodiment will be described. When a layer short-circuit failure Eb occurs at a switch element of a VB high-side driver 16, in the same manner as in the second embodiment, a shunt resistance conductive current (g) drops without reaching a holding current threshold Ah2. When diagnosing a failure in the present embodiment, a current flowing through a shunt resistance 22 is detected by a current detecting circuit 24, and when a voltage value equivalent to the current reaches a first reference voltage generated by a first reference voltage generating circuit 26, a first voltage detection output signal (i) is inverted. Diagnosis is performed by detecting the period of time until the first voltage detection output signal (i) is inverted.

In other words, a chopping signal obtained by taking the first voltage detection output signal (i) and a diagnosis window signal (n) as inputs and subjecting the same to a logical AND computation by an AND circuit 32 is inputted to the chopping time processing circuit 42, and a period of time until inversion (a period of time until a current value of the electromagnetic load 20 reaches a predetermined value) Ta is calculated according to a clock signal generated by the clock signal generating circuit 36. A failure is diagnosed by a diagnosis unit 43 if the chopping time Ta is inconsistent with a predetermined comparison value, and a high output of a diagnosis flag F is performed at a fall of the diagnosis window signal (n).

Accordingly, a layer short-circuit failure can be detected and a highly reliable electromagnetic load driving circuit can be realized. In addition, in the present embodiment, a failure can be determined at the point where a predetermined period of time is exceeded by setting a predetermined threshold to be generated based on a clock signal to an optimal numerical value. As a result, an advantage is provided in that a diagnosis flag F can be set high without having to wait until a fall of the diagnosis window signal (n) (fall of the control signal).

Fourth Embodiment

Figure 7:
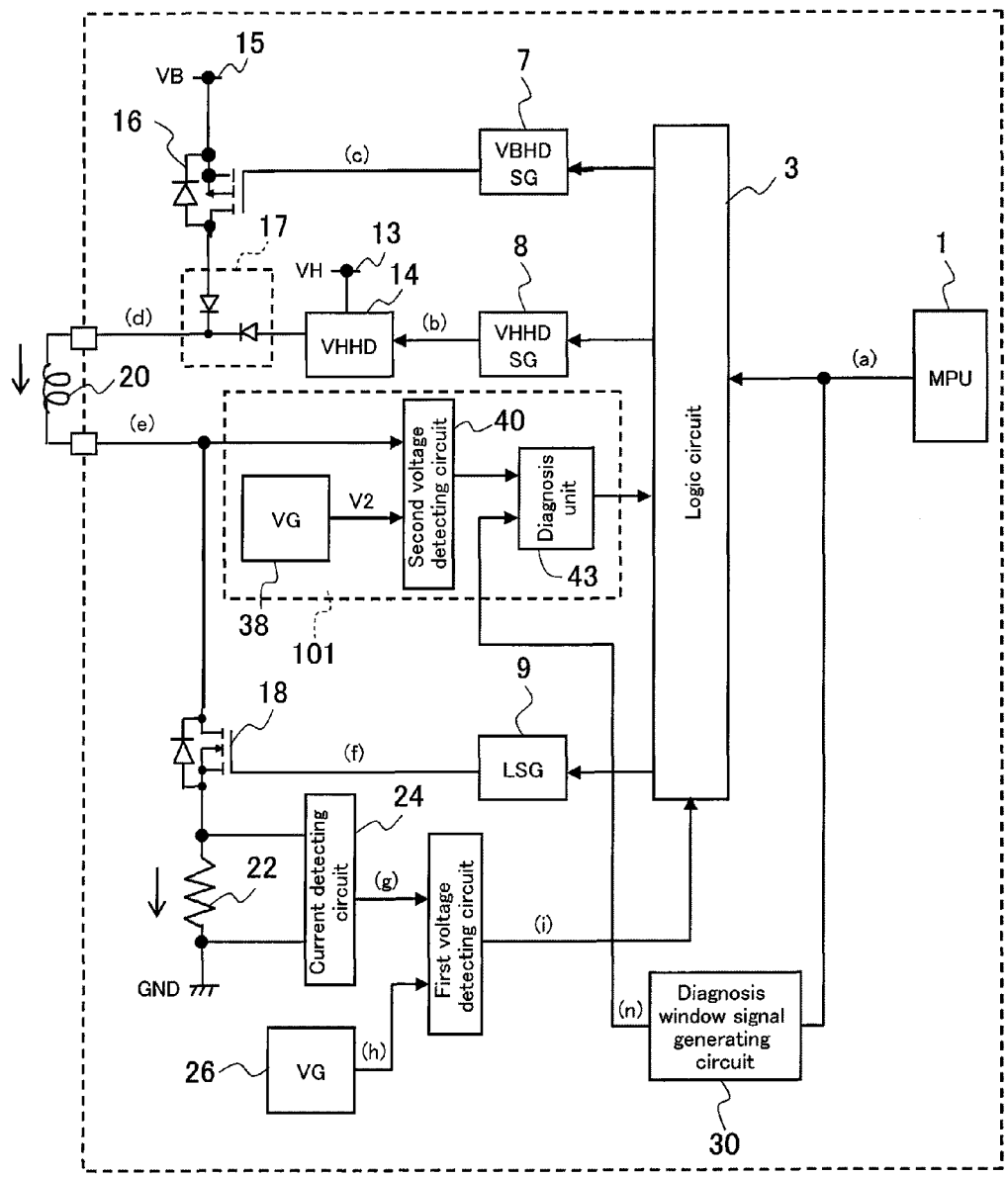
FIG. 7 is a block diagram illustrating a fourth embodiment of an electromagnetic load circuit failure diagnosis device according to the present invention.
Figure 8:
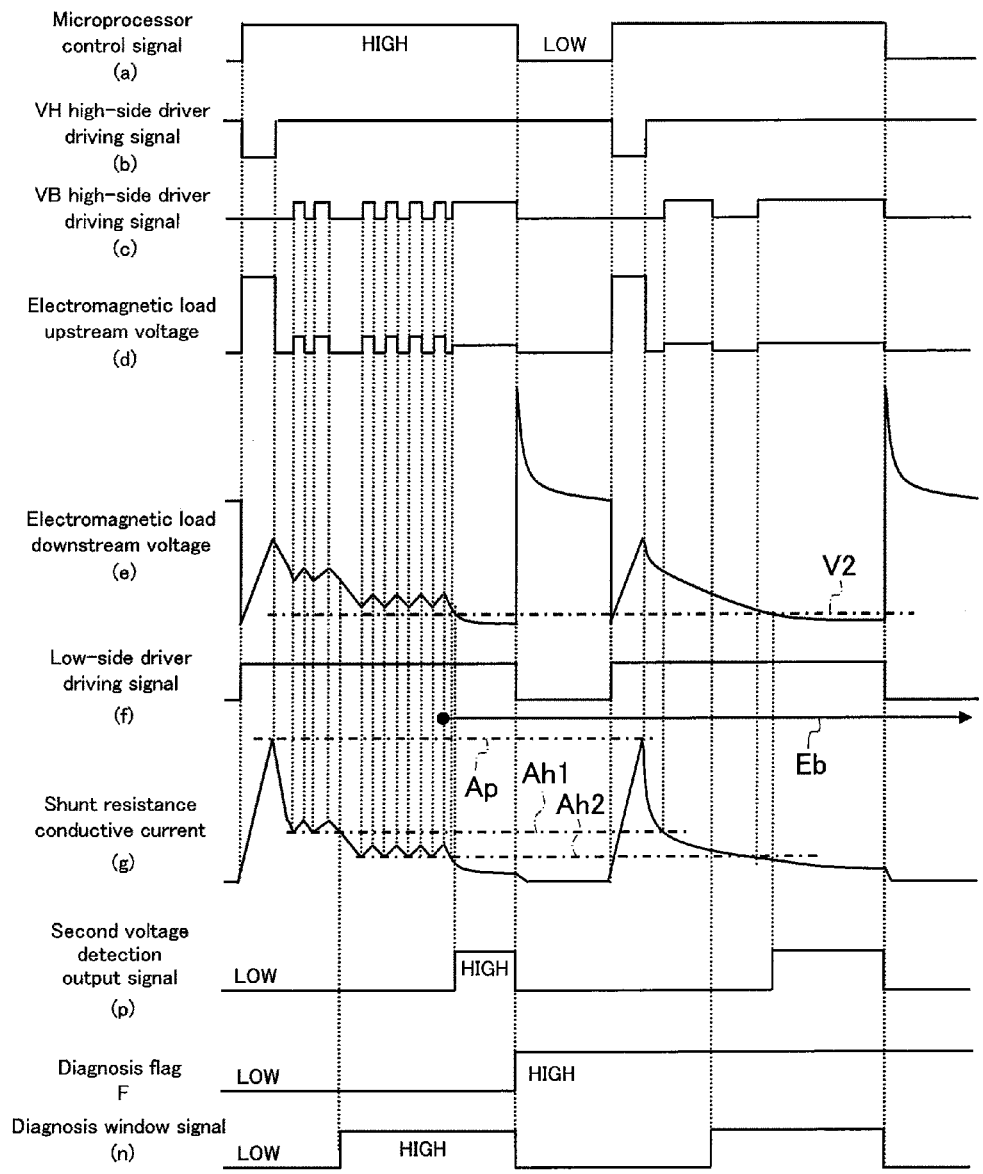
FIG. 8 is a time chart illustrating an operation waveform of a failure diagnosis device according to the fourth embodiment.

A fourth embodiment (specific example) of an electromagnetic load circuit failure diagnosis device according to the present invention will now be described with reference to FIGS. 7 and 8.

The present embodiment uses a voltage value (e) of the upstream or downstream of an electromagnetic load 20 as an input signal for failure diagnosis. As an internal structure, a failure diagnosis circuit 101 includes a second voltage detecting circuit 40 and a second reference voltage generating circuit 38. An output signal (p) of the second voltage detecting circuit 40 and a diagnosis window signal (n) are inputted to a diagnosis unit 43, whereby a layer short-circuit failure is diagnosed depending on whether or not a voltage value of the upstream or downstream of the electromagnetic load 20 reaches a predetermined threshold.

Hereinafter, details of the fourth embodiment will be described. Normally, when a control signal (a) outputted by a microprocessor 1 is turned on and a current flows through a shunt resistance 22, a potential difference is created between the electromagnetic load 20 and a power supply ground (GND) due to an on-resistance of a low-side driver 18 and the shunt resistance 22. Therefore, an electromagnetic load downstream voltage (e) is to indicate a voltage value correlated to a shunt resistance conductive current (g).

When a layer short-circuit failure Eb occurs at the switch element of a VB high-side driver 16, the shunt resistance conductive current (g) drops without reaching a holding current threshold Ah2. In accordance thereto, the voltage value of the electromagnetic load downstream voltage (e) also drops. The electromagnetic load downstream voltage (e) and a second reference voltage value V2 generated by the second reference voltage generating circuit 38 are compared by the second voltage detecting circuit 40, and when the electromagnetic load downstream voltage (e) is lower than the second reference voltage value V2, a second voltage detection output signal (p) becomes high and the diagnosis unit 43 performs a high output of a diagnosis flag F at a fall of the diagnosis window signal (n).

Since the processing described above enables detection of a state in which chopping is suspended and an insufficient current continues to flow, a layer short-circuit failure can be detected and, accordingly, a highly reliable electromagnetic load driving circuit can be realized.

Fifth Embodiment

Figure 9:
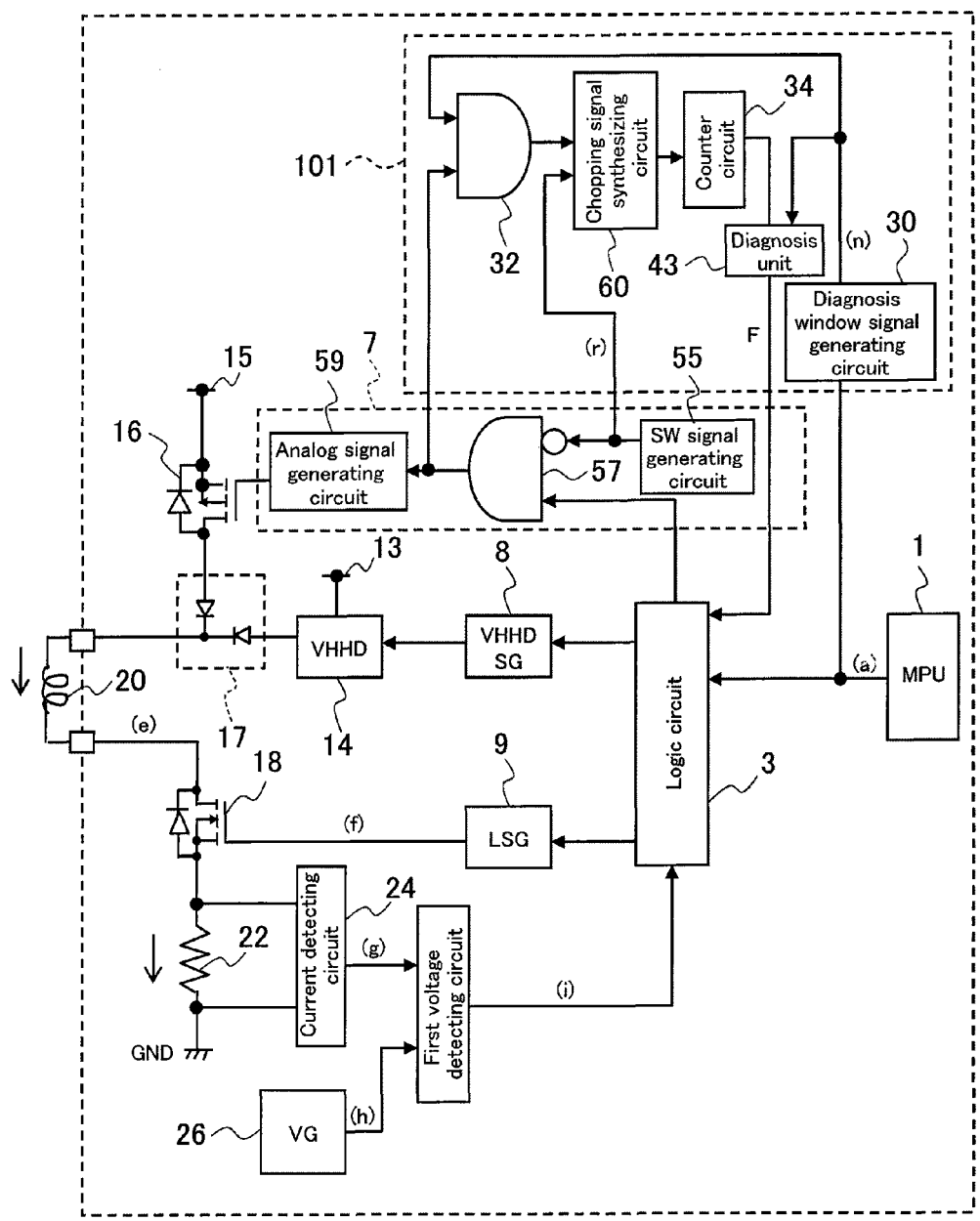
FIG. 9 is a block diagram illustrating a fifth embodiment of an electromagnetic load circuit failure diagnosis device according to the present invention.
Figure 10:
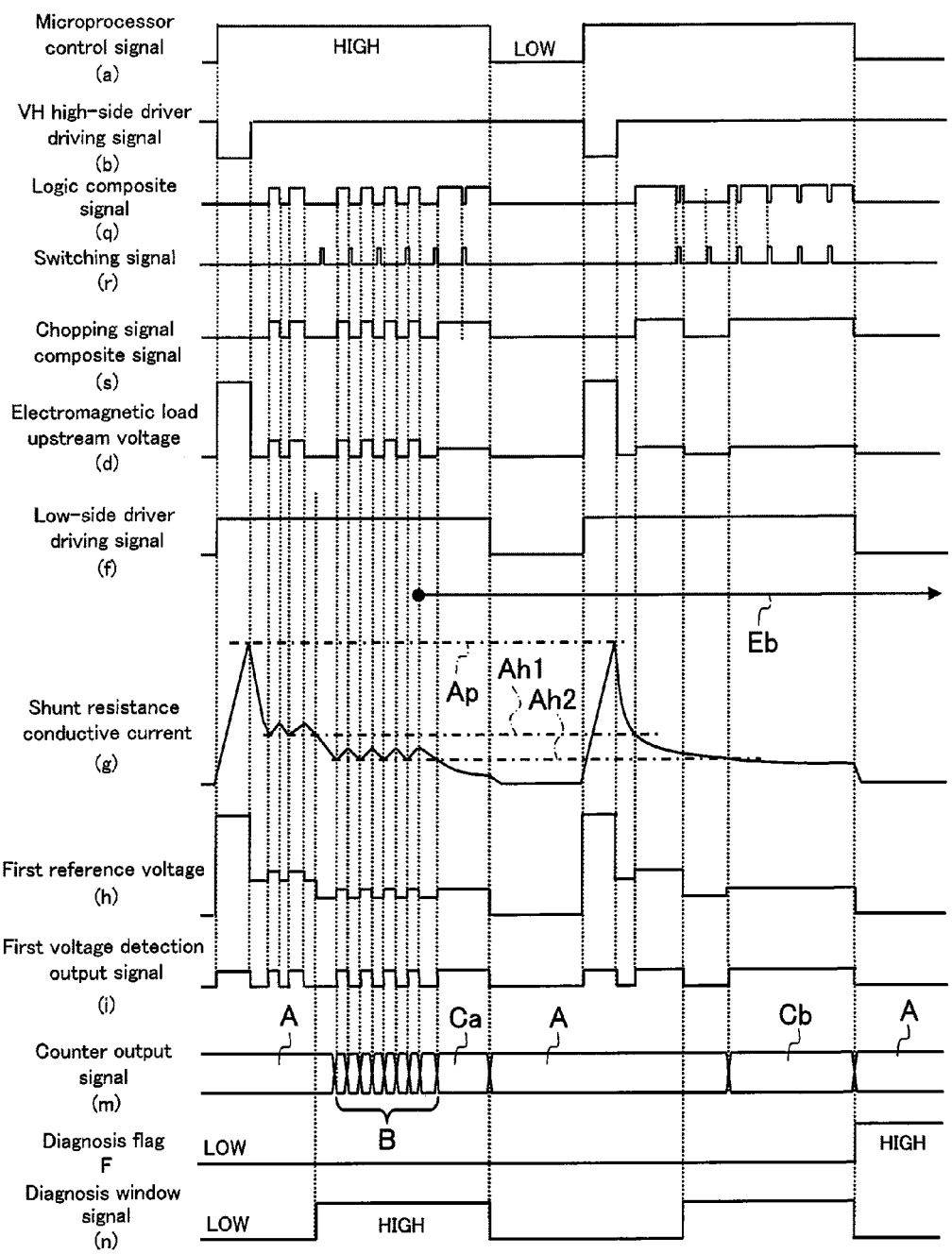
FIG. 10 is a time chart illustrating an operation waveform of a failure diagnosis device according to the fifth embodiment.

A fifth embodiment of an electromagnetic load circuit failure diagnosis device according to the present invention will now be described with reference to FIGS. 9 and 10.

In the present embodiment, a VB high-side driver driving signal (c) outputted by a VB high-side driver driving signal generating circuit 7 is used as an input signal for failure diagnosis. The VB high-side driver driving signal generating circuit 7 includes a switching signal generating circuit 55, an AND circuit 57 to which an inversion signal of a switching signal (r) from the switching signal generating circuit 55 and an output signal of the logic circuit 3 are inputted, and an analog signal generating circuit 59 to which an output signal of the AND circuit 57 is inputted.

As an internal structure, a failure diagnosis circuit 101 includes a chopping signal synthesizing circuit 60 installed between an AND circuit 32 and a counter circuit 34. The chopping signal synthesizing circuit 60 receives a switching signal of the switching signal generating circuit 55 and a chopping signal that is an output signal of the AND circuit 32 as inputs and outputs a chopping signal composite signal (s).

When the switch element driving signal generating circuit is designed so as to generate a switch element driving signal based on a feedback compensation of an electrical signal correlated with a current value of an electromagnetic load 20, a layer short-circuit failure diagnosis algorithm according to the present embodiment performs a layer short-circuit failure diagnosis by counting the number of on/off operations of the switch element driving signal and comparing the counted number of on/off operations with a predetermined threshold.

Other basic operations are unchanged from the second embodiment.

Hereinafter, details of the fifth embodiment will be described. In order to drive a switch element installed between a battery voltage terminal 15 and the electromagnetic load 20 in the same manner as a switch element of a VB high-side driver 16, normally, a gate voltage of the VB high-side driver 16 is boosted higher than a battery voltage VB by the analog signal generating circuit 59 in order to secure a gate-source potential difference. Therefore, generally, the gate voltage of the VB high-side driver 16 is boosted by regulating to a capacitance connected between a source-side of the VB high-side driver 16 and the battery voltage terminal 15 using switching of the VB high-side driver 16.

However, when the battery voltage VB is low and boosting cannot be performed because the VB high-side driver 16 is unable to perform switching, the VB high-side driver 16 is forcibly switched and boosted by a switching signal (r) generated by the switching signal generating circuit 55.

When a layer short-circuit failure Eb occurs at the switch element of a VB high-side driver 16, the shunt resistance conductive current (g) drops without reaching a holding current threshold Ah2. At the same time, a logic composite signal (q) that is an output signal of the AND circuit 57 to which a logic driving signal of a VB high-side driver outputted from the logic circuit 3 and the switching signal (r) are inputted is to be taken as an input signal to the AND circuit 32 of the failure diagnosis circuit 101.

Under the influence of the switching signal (r), there is a risk of a wrong diagnosis of a chopping signal to be outputted from the AND circuit 32 that receives the diagnosis window signal (n) and the logic composite signal (q) as input signals. In such a case, the influence of the switching signal (r) is masked by attaining synchronization at the chopping signal synthesizing circuit 60 with the switching signal (r) and the chopping signal outputted by the AND circuit 32 as input signals.

A switching signal composite signal (s) outputted by the chopping signal synthesizing circuit 60 is taken as an input signal to the counter circuit 34. The number of choppings of the switching signal composite signal (s) is counted by the counter circuit 34 and a high output of a diagnosis flag F is performed by the diagnosis unit 43 at a fall of the diagnosis window signal (n).

As seen, similarly in the present embodiment, a layer short-circuit failure is detected by counting the number of on/off control operations of chopping. The detection of a layer short-circuit failure enables a highly reliable electromagnetic load driving circuit to be realized.

Sixth Embodiment

Figure 11:
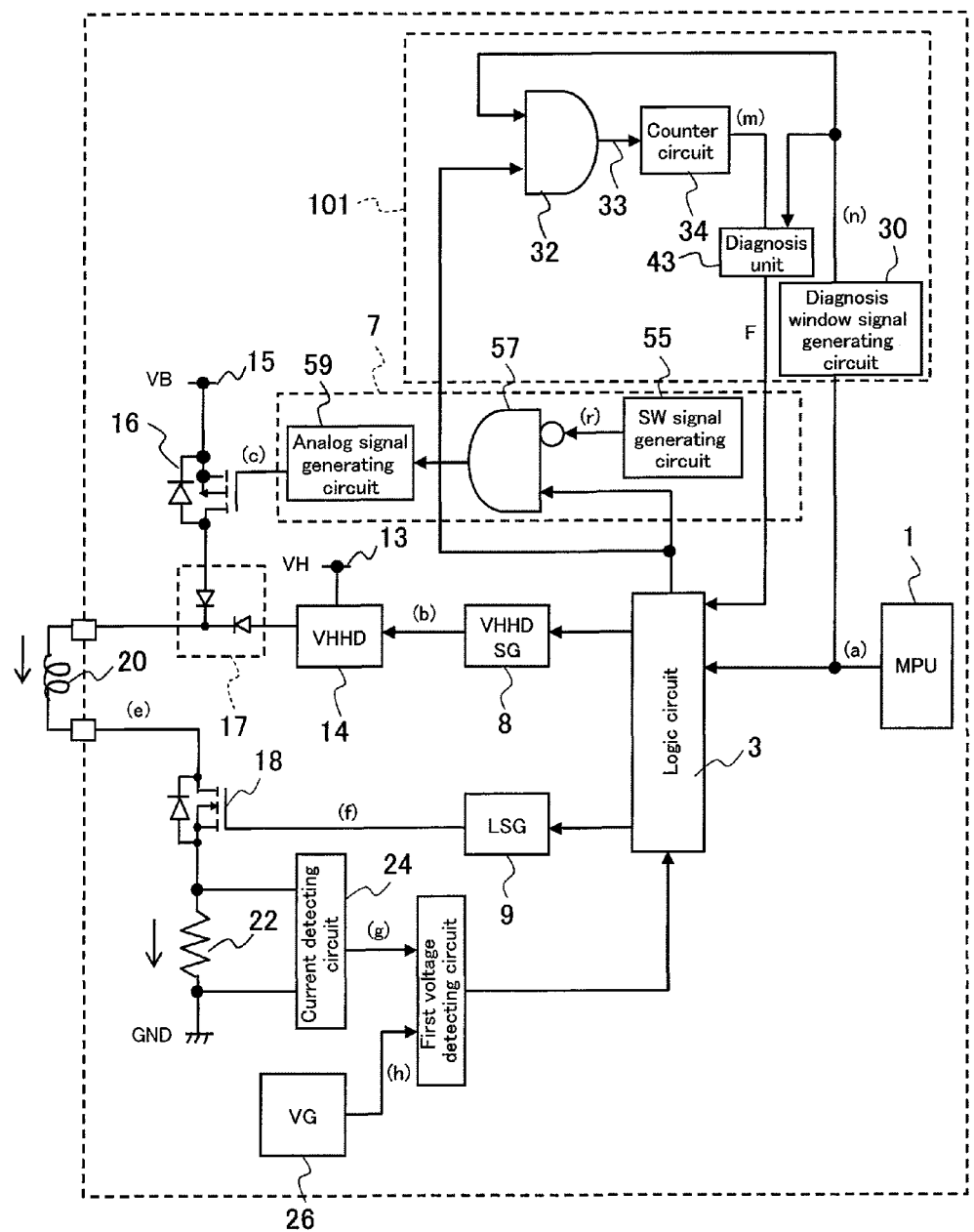
FIG. 11 is a block diagram illustrating a sixth embodiment of an electromagnetic load circuit failure diagnosis device according to the present invention.
Figure 12:
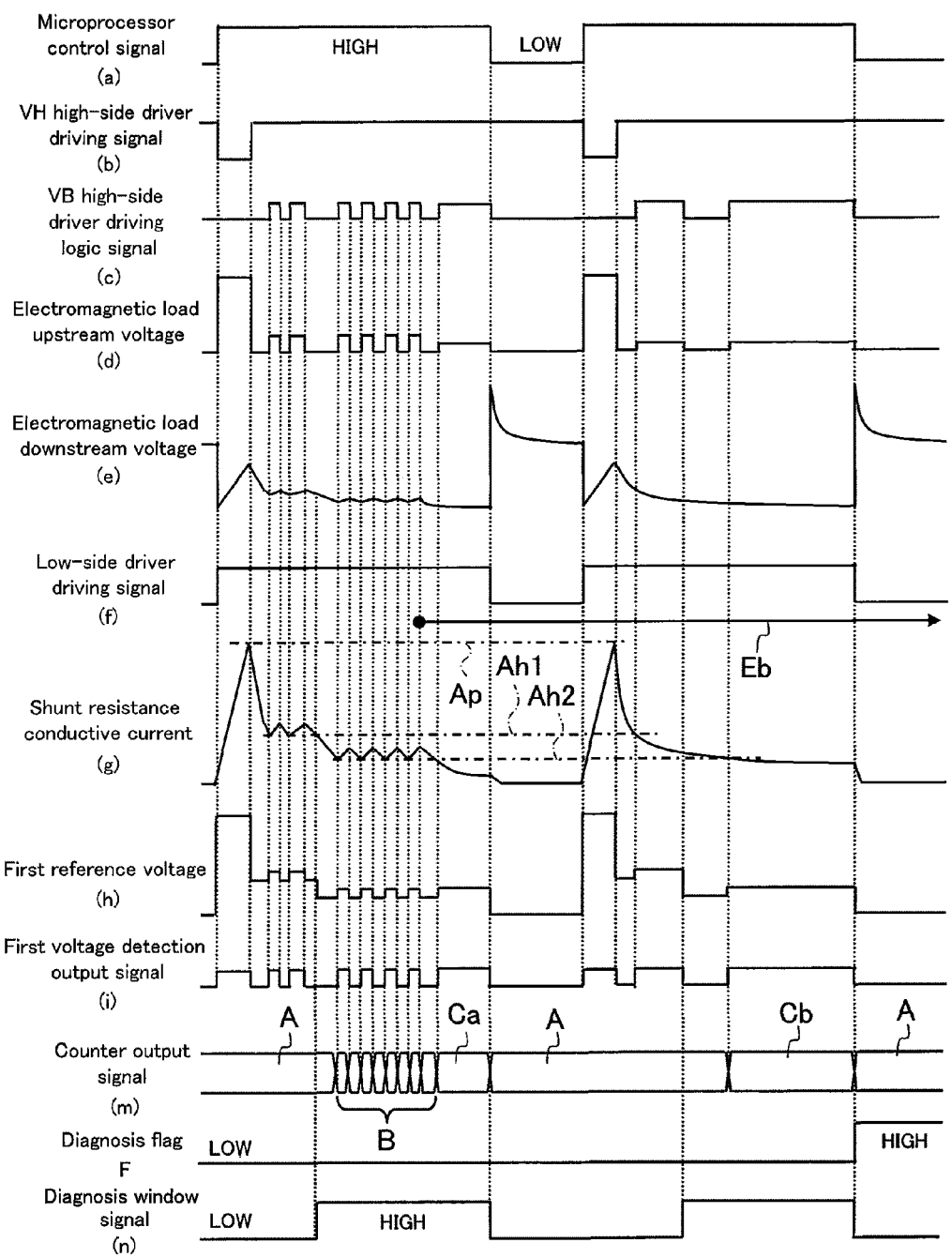
FIG. 12 is a time chart illustrating an operation waveform of a failure diagnosis device according to the sixth embodiment.

A sixth embodiment of an electromagnetic load circuit failure diagnosis device according to the present invention will now be described with reference to FIGS. 11 and 12.

In the present embodiment, a logic signal outputted by a logic circuit 3 to a VB high-side driver driving signal generating circuit 7 is used as an input signal for failure diagnosis. An internal structure of a failure diagnosis circuit 101 is substantially the same as that in the second embodiment, whereby when the logic circuit 3 which can be described as being a switch element driving signal generating circuit is arranged so as to generate a switch element driving signal based on a feedback compensation of an electrical signal correlated with a current value of an electromagnetic load 20, a layer short-circuit failure diagnosis is performed by counting the number of on/off operations of the switch element driving signal and comparing the counted number of on/off operations with a predetermined threshold.

Hereinafter, details of the sixth embodiment will be described. When a layer short-circuit failure Eb occurs at a switch element of a VB high-side driver 16, in the same manner as in the fifth embodiment, a shunt resistance conductive current (g) drops without reaching a holding current threshold Ah2. At the same time, a logic driving signal for the VB high-side driver 16 outputted from the logic circuit 3 and a diagnosis window signal (n) are taken as input signals to an AND circuit 32 of the failure diagnosis circuit 101. Chopping signals outputted by the AND circuit 32 are inputted to the counter circuit 34, whereby the number of choppings is counted by the counter circuit 34. Subsequently, the diagnosis unit 43 performs a high output of a diagnosis flag F at a fall of the diagnosis window signal (n).

Since this processing similarly enables detection of a state in which chopping is suspended and an insufficient current continues to flow into the VB high-side driver 16, a layer short-circuit failure of the VB high-side driver 16 can be detected and, accordingly, a highly reliable electromagnetic load driving circuit can be realized.

Seventh Embodiment

Figure 13:
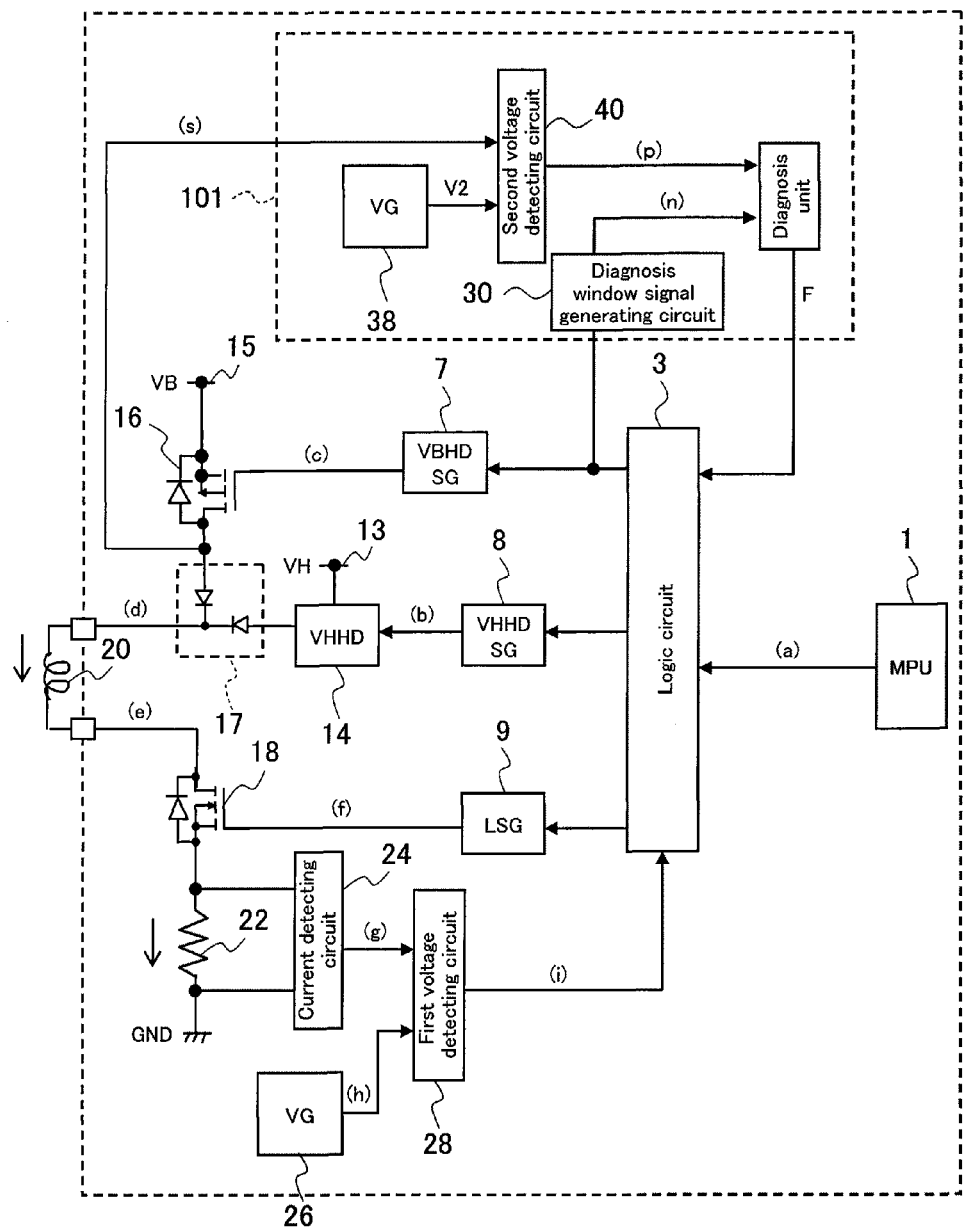
FIG. 13 is a block diagram illustrating a seventh embodiment of an electromagnetic load circuit failure diagnosis device according to the present invention.
Figure 14:
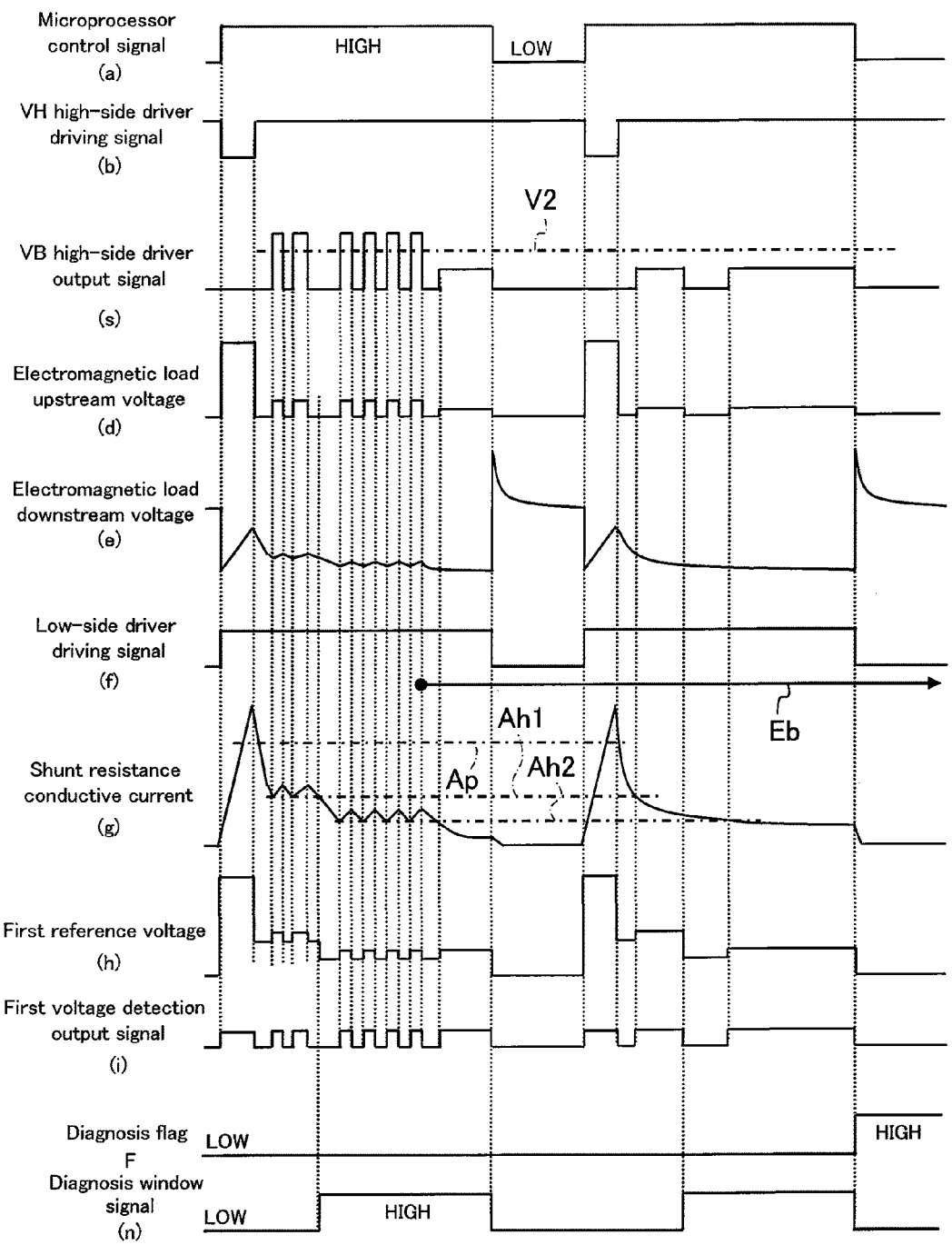
FIG. 14 is a time chart illustrating an operation waveform of a failure diagnosis device according to the seventh embodiment.

A seventh embodiment of an electromagnetic load circuit failure diagnosis device according to the present invention will now be described with reference to FIGS. 13 and 14.

In the present embodiment, a source voltage of a VB high-side driver 16 or, in other words, a VB high-side driver output signal (s) is used as an input signal to a failure diagnosis circuit 101. An internal structure of the failure diagnosis circuit 101 is substantially the same as that of the fourth embodiment, and a layer short-circuit failure is diagnosed depending on whether or not a level of an output signal of a high-side switch element is equal to or greater than a threshold.

Hereinafter, details of the seventh embodiment will be described. Normally, when a control signal (a) outputted by a microprocessor 1 is turned on and chopping of the VB high-side driver 16 is performed, the source voltage of the VB high-side driver 16 is chopped between a battery voltage and 0 (zero) V.

When a layer short-circuit failure Eb occurs at the switch element of a VB high-side driver 16, the shunt resistance conductive current (g) drops without reaching a holding current threshold Ah2. At the same time, since the VB high-side driver 16 can no longer perform chopping, the VB high-side driver output signal (s) cannot be turned on up to the level of the battery voltage VB and enters an incomplete on-state.

The level of the VB high-side driver output signal (s) is monitored by a second voltage detecting circuit 40. When the VB high-side driver output signal (s) drops below a second reference voltage V2, a diagnosis unit 43 performs a high output of a diagnosis flag F at a fall of a diagnosis window signal (n).

Since such processing similarly enables detection of a state in which chopping is suspended and an insufficient current continues to flow into the VB high-side driver 16, a layer short-circuit failure of the VB high-side driver 16 can be detected and, accordingly, a highly reliable electromagnetic load driving circuit can be realized.

Eighth Embodiment

Figure 15:
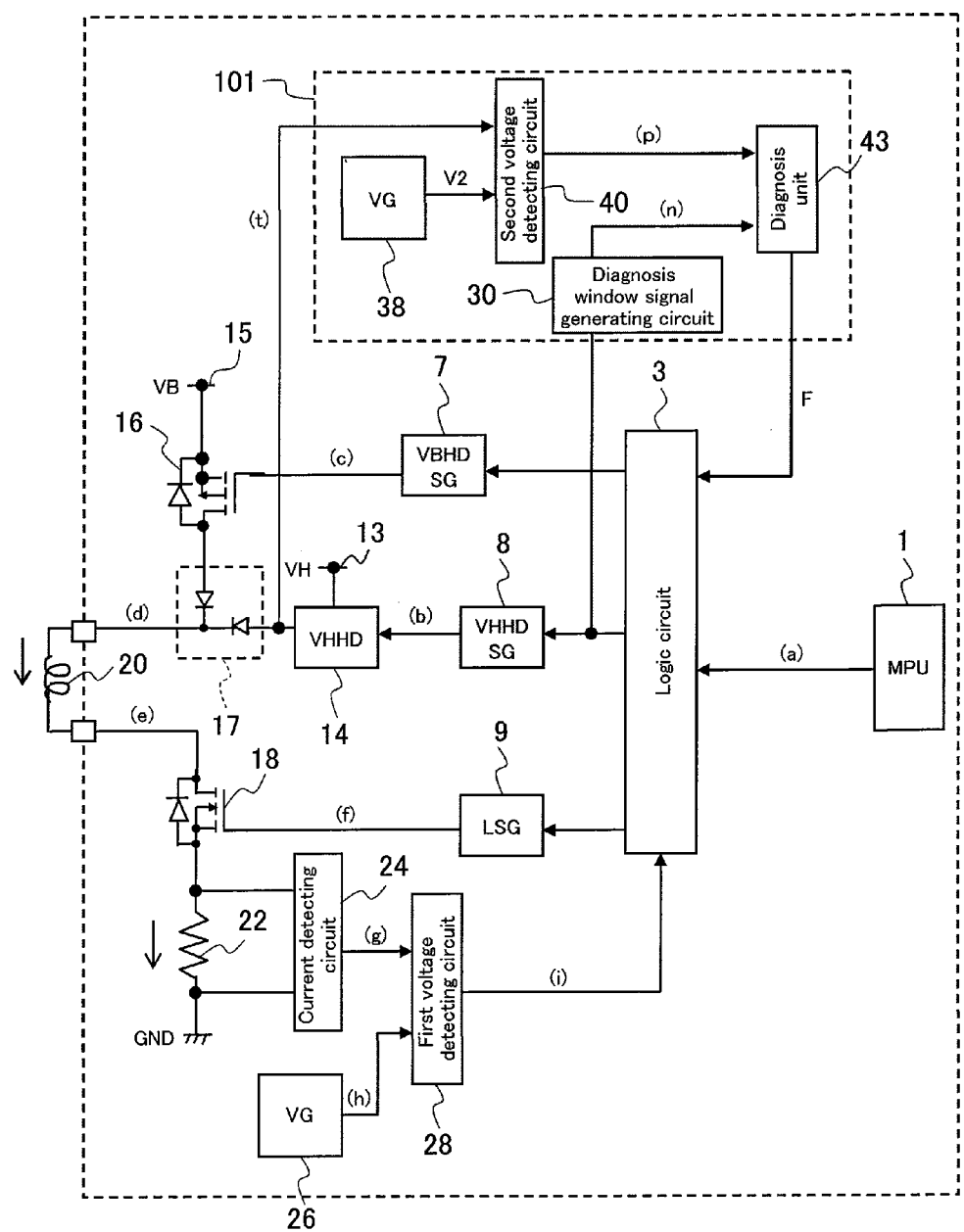
FIG. 15 is a block diagram illustrating an eighth embodiment of an electromagnetic load circuit failure diagnosis device according to the present invention.
Figure 16:
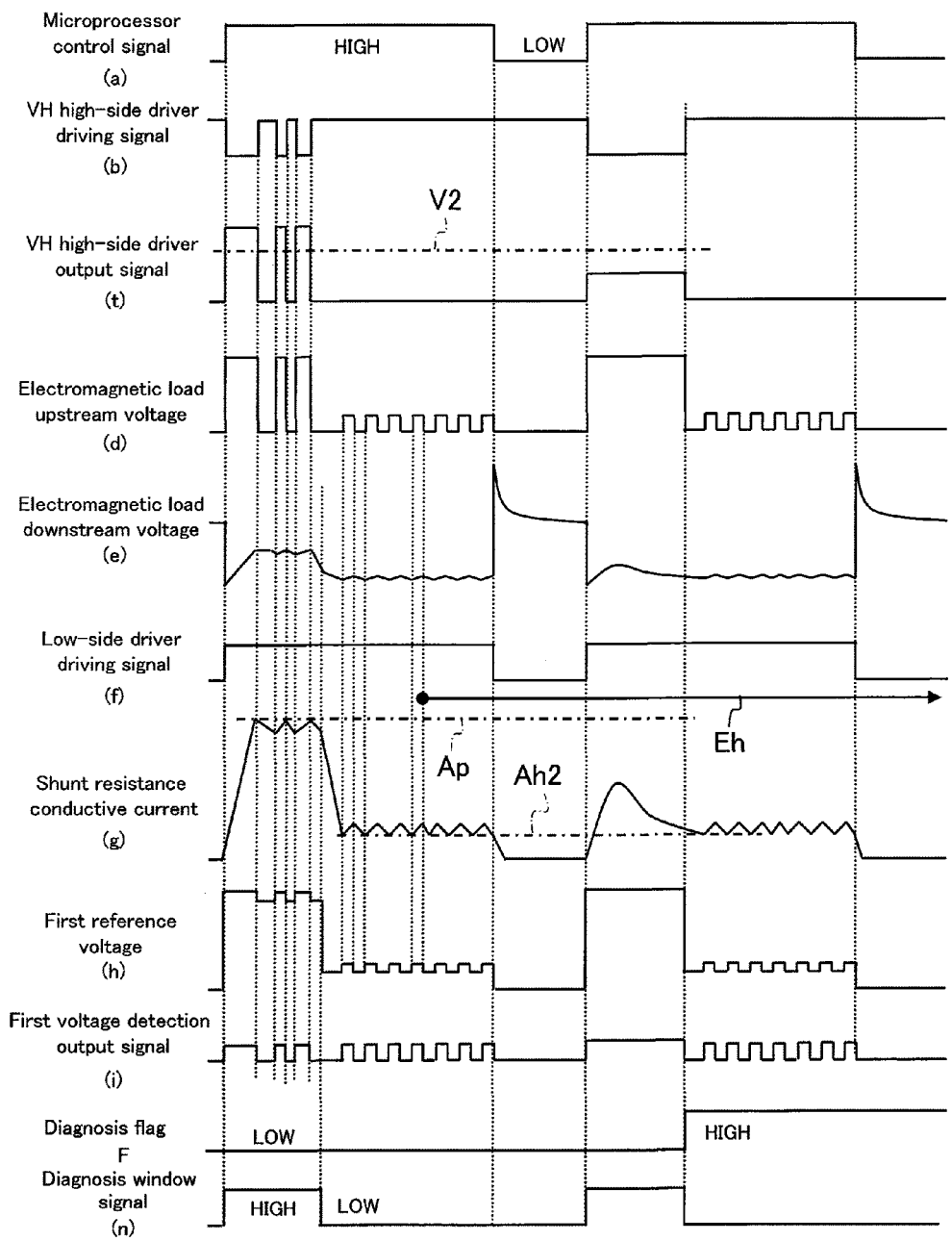
FIG. 16 is a time chart illustrating an operation waveform of a failure diagnosis device according to the eighth embodiment.

An eighth embodiment of an electromagnetic load circuit failure diagnosis device according to the present invention will now be described with reference to FIGS. 15 and 16.

In the present embodiment, an output signal (t) of a VH high-side driver 14 is used as an input signal for failure diagnosis. An internal structure of the failure diagnosis circuit 101 is substantially the same as that of the seventh embodiment, and a layer short-circuit failure is diagnosed depending on whether or not a level of the output signal (t) of the VH high-side driver 14 is equal to or greater than a threshold.

Moreover, a diagnosis window signal generating circuit 30 generates a diagnosis window signal (n) using a logic signal outputted by a logic circuit 3 to a VH high-side driver driving signal generating circuit 8.

Hereinafter, details of the eighth embodiment will be described. Normally, when a control signal (a) of a microprocessor 1 is turned on and chopping of the VH high-side driver 14 is performed, a source voltage of the VH high-side driver 14 is chopped between a boosting voltage VH and 0 (zero) V.

When a layer short-circuit failure Eh occurs at a switch element of the VH high-side driver 14, the VH high-side driver 14 cannot be turned on and becomes unable to perform chopping. Therefore, the VH high-side driver output signal (t) cannot be turned on up to the level of the boosting voltage VH and enters an incomplete on-state.

A level (voltage) of the VH high-side driver output signal (t) is monitored by a second voltage detecting circuit 40. When the VH high-side driver output signal (t) drops below a predetermined second reference voltage V2, a diagnosis unit 43 performs a high output of a diagnosis flag F at a fall of a diagnosis window signal (n).

Since such processing enables detection of a state in which chopping of the VH high-side driver 14 is suspended and an insufficient current continues to flow into the VH high-side driver 14, a layer short-circuit failure of the VH high-side driver 14 can be detected and, accordingly, a highly reliable electromagnetic load driving circuit can be realized.

Ninth Embodiment

Figure 17:
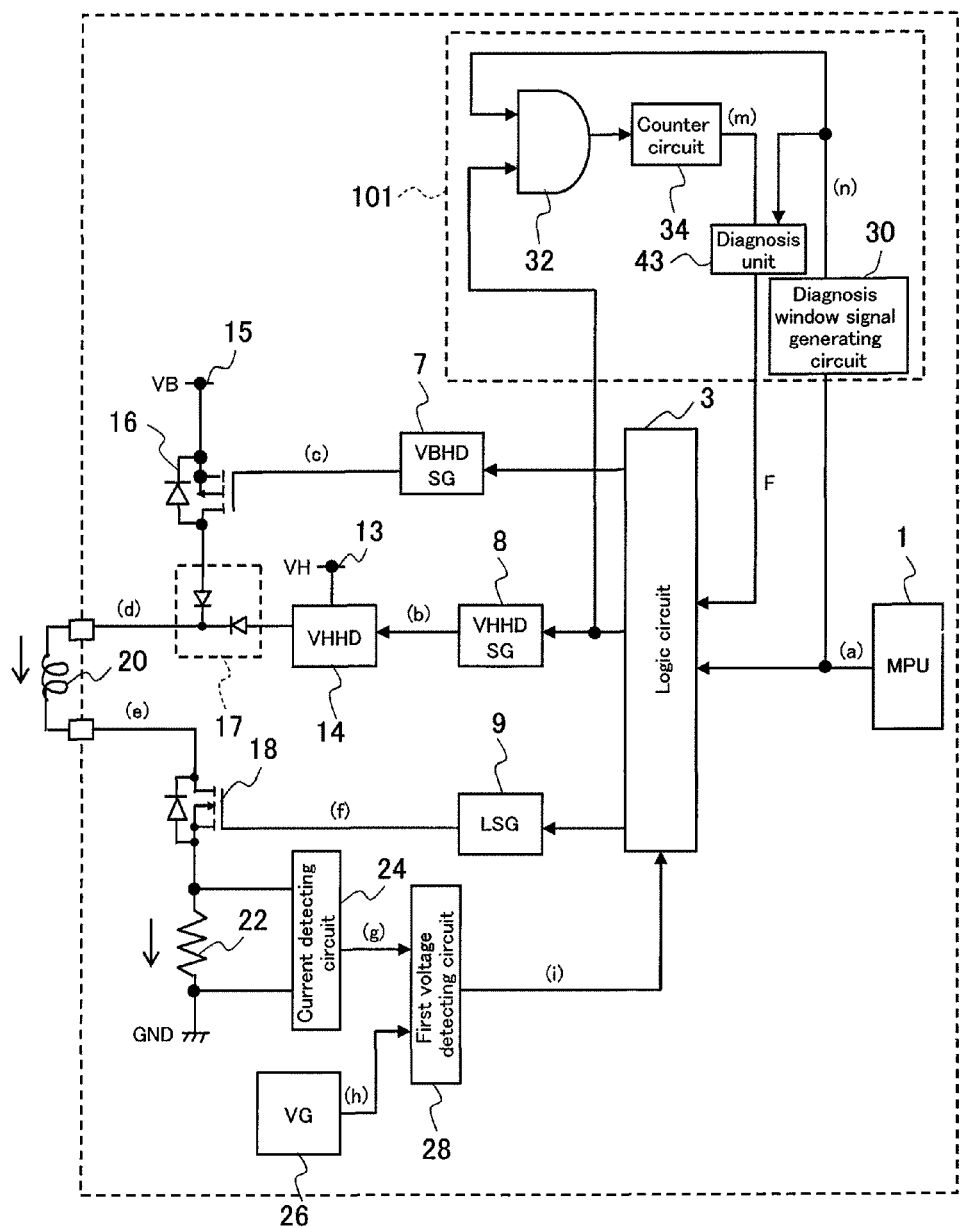
FIG. 17 is a block diagram illustrating a ninth embodiment of an electromagnetic load circuit failure diagnosis device according to the present invention.
Figure 18:
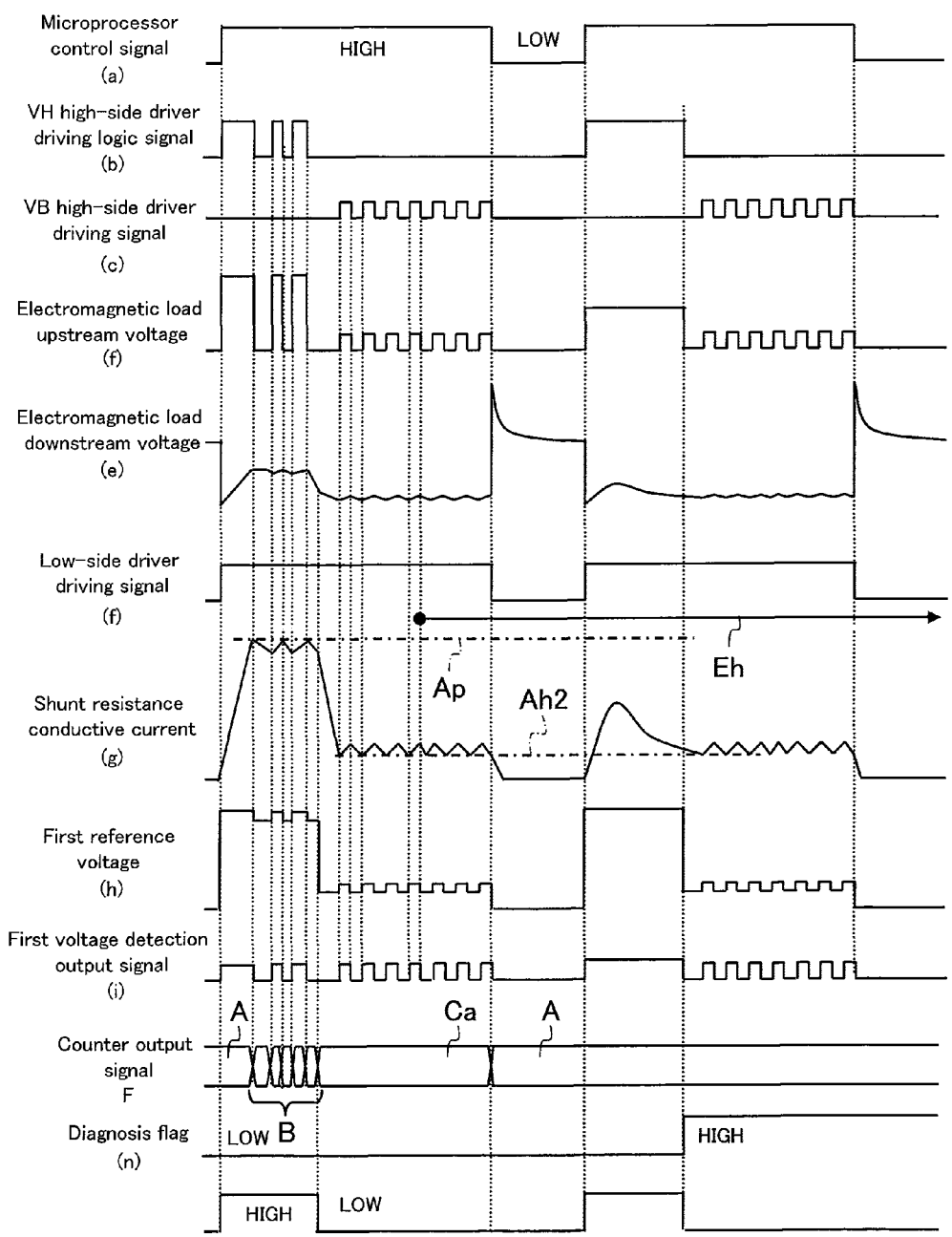
FIG. 18 is a time chart illustrating an operation waveform of a failure diagnosis device according to the ninth embodiment.

A ninth embodiment of an electromagnetic load circuit failure diagnosis device according to the present invention will now be described with reference to FIGS. 17 and 18.

In the present embodiment, a logic signal outputted by a logic circuit 3 to a VH high-side driver driving signal generating circuit 8 is used as an input signal for failure diagnosis. An internal structure of a failure diagnosis circuit 101 is substantially the same as that in the second embodiment, whereby when the logic circuit 3 which can be described as being a switch element driving signal generating circuit is arranged so as to generate a switch element driving signal based on a feedback compensation of an electrical signal correlated with a current value of an electromagnetic load 20, a layer short-circuit failure diagnosis is performed by counting the number of on/off operations of the switch element driving signal and comparing the counted number of on/off operations with a predetermined threshold.

Hereinafter, details of the ninth embodiment will be described. Normally, when a control signal (a) outputted by a microprocessor 1 is turned on and chopping of the VH high-side driver 14 is performed, a source voltage of the VH high-side driver 14 is chopped between a boosting voltage VH and 0 (zero) V.

When a layer short-circuit failure Eh occurs at the switch element of the VH high-side driver 14, a shunt resistance conductive current (g) drops without reaching a peak current threshold Ap. At the same time, a logic driving signal of the VH high-side driver 14 outputted from the logic circuit 3 is inputted to the failure diagnosis circuit 101 and the number of choppings is counted by a counter circuit 34. Subsequently, a diagnosis unit 43 performs a high output of a diagnosis flag F at a fall of a diagnosis window signal (n).

Since such processing enables detection of a state in which chopping of the VH high-side driver 14 is suspended and an insufficient current continues to flow into the VH high-side driver 14, a layer short-circuit failure of the VH high-side driver 14 can be detected and, accordingly, a highly reliable electromagnetic load driving circuit can be realized.

With any of the embodiments described above, an electromagnetic load circuit and a failure diagnosis device can either be configured by hardware including an integrated circuit, an external circuit, and the like, or by software involving a computer program to be executed by a microcomputer.

The invention claimed is:

1. An electromagnetic load circuit failure diagnosis device in which a high-side switch element is connected on a side of a power supply voltage terminal of an electromagnetic load provided between the power supply voltage terminal and a ground, a low-side switch element connected on the ground side, the high-side switch element and the low-side switch element opened/closed by a control signal of a switch element driving signal generating circuit, the failure diagnosis device comprising:

failure diagnosis means that detects a layer short-circuit failure in which the high-side switch element, the low-side switch element or the electromagnetic load short-circuits with the power supply voltage terminal or the ground in a state of having a predetermined impedance, and performs a failure diagnosis, wherein the failure diagnosis means performs a layer short-circuit failure diagnosis during the period when a current is conducted through the electromagnetic load by the control signal of the switch element driving signal generating circuit, and detects a layer short-circuit failure by comparing the number of on/off operations of chopping of the high-side switch element or the low-side switch element with a predetermined number of times that is a failure diagnosis threshold.

2. The electromagnetic load circuit failure diagnosis device according to claim 1, wherein the failure diagnosis means performs a layer short-circuit failure diagnosis at a timing of a rise or a fall of a control signal inputted to the switch element driving signal generating circuit.

3. The electromagnetic load circuit failure diagnosis device according to claim 1, wherein the number of on/off operations of chopping is the number of times an electrical value correlated with a current value of the electromagnetic load exceeds a predetermined threshold.

4. An electromagnetic load circuit failure diagnosis device in which a high-side switch element is connected on a side of a power supply voltage terminal of an electromagnetic load provided between the power supply voltage terminal and a ground, a low-side switch element connected on the ground side, the high-side switch element and the low-side switch element opened/closed by a control signal of a switch element driving signal generating circuit, the failure diagnosis device comprising:

failure diagnosis means that detects a layer short-circuit failure in which the high-side switch element, the low-side switch element or the electromagnetic load short-circuits with the power supply voltage terminal or the ground in a state of having a predetermined impedance, and performs a failure diagnosis, wherein the failure diagnosis means performs a layer short-circuit failure diagnosis during the period when a current is conducted through the electromagnetic load by the control signal of the switch element driving signal generating circuit, and detects a layer short-circuit failure by measuring a period of time from the start of driving at a timing of a rise or a fall of a control signal inputted to the switch element driving signal generating circuit until when a current value of the electromagnetic load exceeds a predetermined threshold.

5. An electromagnetic load circuit failure diagnosis device in which a high-side switch element is connected on a side of a power supply voltage terminal of an electromagnetic load provided between the power supply voltage terminal and a ground, a low-side switch element connected on the ground side, the high-side switch element and the low-side switch element opened/closed by a control signal of a switch element driving signal generating circuit, the failure diagnosis device comprising:

failure diagnosis means that detects a layer short-circuit failure in which the high-side switch element, the low-side switch element or the electromagnetic load short-circuits with the power supply voltage terminal or the ground in a state of having a predetermined impedance, and performs a failure diagnosis, wherein the failure diagnosis means performs a layer short-circuit failure diagnosis during the period when a current is conducted through the electromagnetic load by the control signal of the switch element driving signal generating circuit, and wherein the switch element driving signal generating circuit generates a switch element driving signal based on a feedback compensation of an electrical signal correlated with a current value of the electromagnetic load, and the failure diagnosis means performs a layer short-circuit failure diagnosis by counting the number of on/off operations of the switch element driving signal and comparing the counted number of on/off operations with a predetermined threshold.

* * * * *